(12) United States Patent
Lee et al.

(10) Patent No.: US 11,706,999 B2
(45) Date of Patent: Jul. 18, 2023

(54) SEMICONDUCTOR DEVICE AND MANUFACTURING METHOD OF SEMICONDUCTOR DEVICE

(71) Applicant: Taiwan Semiconductor Manufacturing Co., Ltd., Hsinchu (TW)

(72) Inventors: Chien-Min Lee, Hsinchu (TW); Shy-Jay Lin, Jhudong Township (TW); Yen-Lin Huang, Hsinchu (TW); MingYuan Song, Hsinchu (TW); Tung Ying Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/369,484

(22) Filed: Jul. 7, 2021

(65) Prior Publication Data

US 2022/0223785 A1  Jul. 14, 2022

Related U.S. Application Data

(60) Provisional application No. 63/136,737, filed on Jan. 13, 2021.

(51) Int. Cl.
| | | |
|---|---|---|
| H01L 43/00 | (2006.01) |
| H01L 43/04 | (2006.01) |
| H01L 43/14 | (2006.01) |
| H01L 27/22 | (2006.01) |
| H01L 43/10 | (2006.01) |

(52) U.S. Cl.
CPC ............ *H01L 43/04* (2013.01); *H01L 27/228* (2013.01); *H01L 43/10* (2013.01); *H01L 43/14* (2013.01)

(58) Field of Classification Search
CPC ....... H01L 43/04; H01L 27/228; H01L 43/10; H01L 43/14; H01L 43/12
See application file for complete search history.

(56) References Cited

U.S. PATENT DOCUMENTS

| | | | |
|---|---|---|---|
| 10,229,723 B1* | 3/2019 | Choi | G11C 11/1675 |
| 2016/0359102 A1* | 12/2016 | Hong | H01L 43/08 |
| 2019/0080738 A1* | 3/2019 | Choi | H01L 43/04 |
| 2019/0304523 A1* | 10/2019 | O'Brien | G11C 11/161 |
| 2020/0286536 A1* | 9/2020 | Fukami | H01L 43/12 |
| 2020/0286539 A1 | 9/2020 | Matsubara | |
| 2021/0280774 A1 | 9/2021 | Lee et al. | |
| 2022/0328559 A1 | 10/2022 | Tsai et al. | |

FOREIGN PATENT DOCUMENTS

| | | |
|---|---|---|
| JP | 6923213 B2 | 8/2021 |
| KR | 20150095187 A | 8/2015 |
| KR | 20200087991 A | 7/2020 |
| KR | 20200133182 A | 11/2020 |

* cited by examiner

*Primary Examiner* — Latanya N Crawford Eason
(74) *Attorney, Agent, or Firm* — Slater Matsil, LLP

(57) ABSTRACT

Semiconductor device includes pair of active devices, composite spin Hall electrode, and a magnetic tunnel junction. Composite spin Hall electrode is electrically connected to pair of active devices. Magnetic tunnel junction is disposed on opposite side of composite spin hall electrode with respect to pair of active devices. Spin Hall electrode includes pair of heavy metal layers, and spacer layer disposed in between pair of heavy metal layers. Pair of heavy metal layers is made of a heavy metal in a metastable state. Spacer layer comprises first material different from the pair of heavy metal layers.

20 Claims, 29 Drawing Sheets

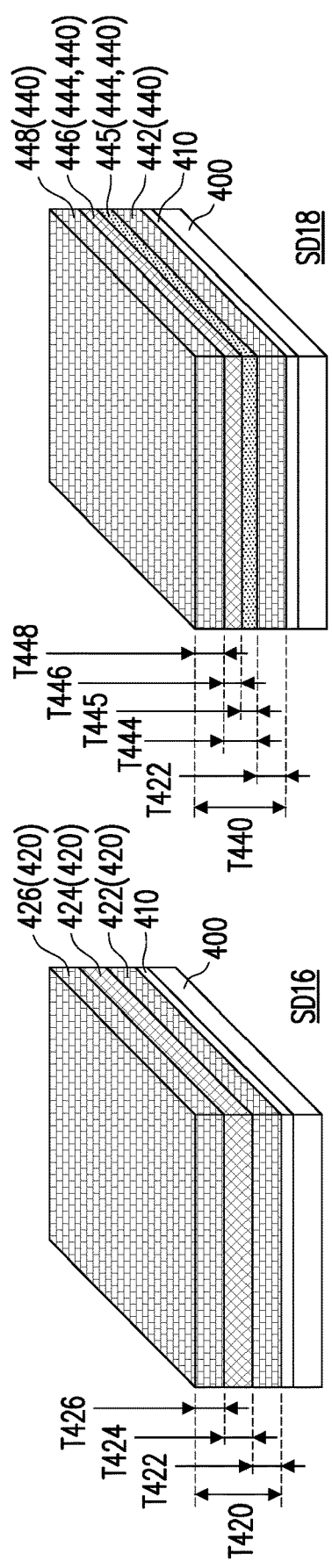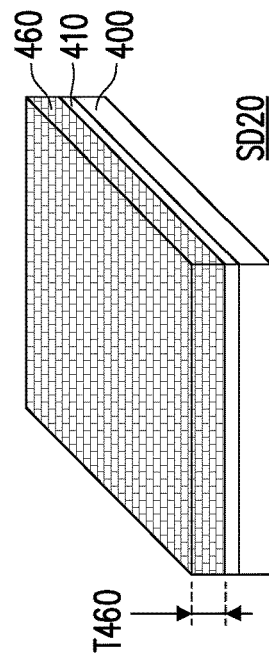
FIG. 7A
FIG. 7B
FIG. 7C

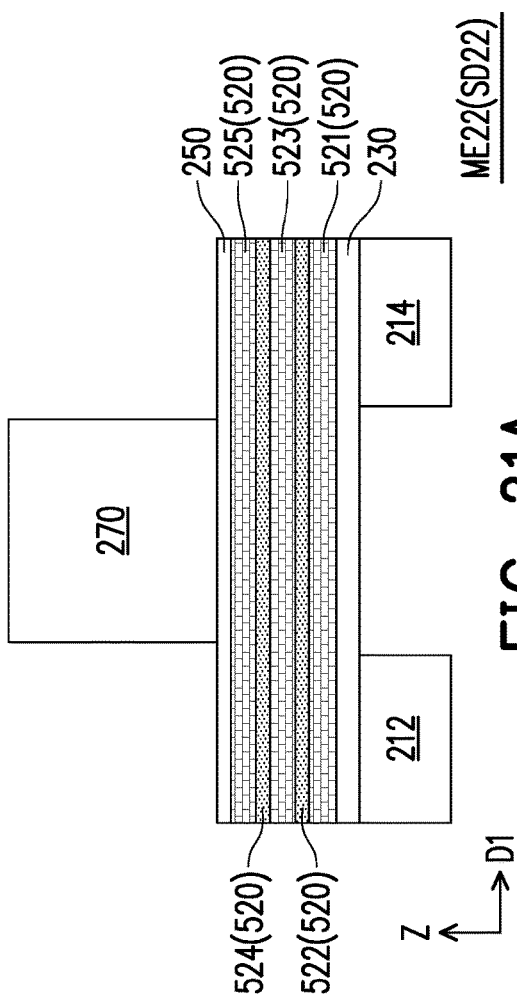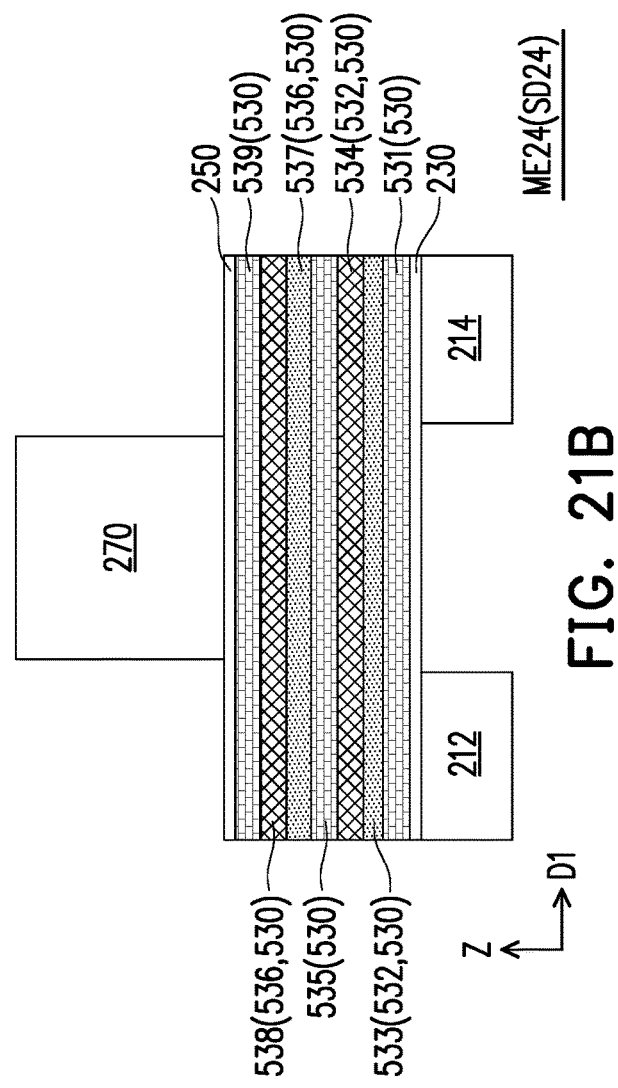

US 11,706,999 B2

SEMICONDUCTOR DEVICE AND MANUFACTURING METHOD OF SEMICONDUCTOR DEVICE

PRIORITY CLAIM AND CROSS-REFERENCE

This application claims the benefit of U.S. Provisional Application No. 63/136,737 filed on Jan. 13, 2021, entitled "Spin-Hall Electrode of SOT-MRAM," which application is hereby incorporated herein by reference.

BACKGROUND

Semiconductor devices are used in integrated circuits for electronic applications, including radios, televisions, cell phones, and personal computing devices, as examples. To respond to the increasing demand for miniaturization, higher speed, and better electrical performance (e.g., lower power consumption, increased reliability) new structures and materials are actively researched. For example, new memory types such as spin transfer torque magnetic random access memory (STT-MRAM) and spin orbit torque (SOT) MRAM have been recently developed in the attempt to reduce power consumption and/or access times, increase reliability, or other performance indicators as required by the intended application.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A to FIG. 7C are schematic perspective views of semiconductor devices according to some embodiments of the disclosure.

FIG. 21A and FIG. 21B are schematic cross-sectional views of memory cells of semiconductor devices according to some embodiments of the disclosure.

DETAILED DESCRIPTION

Figure 1:
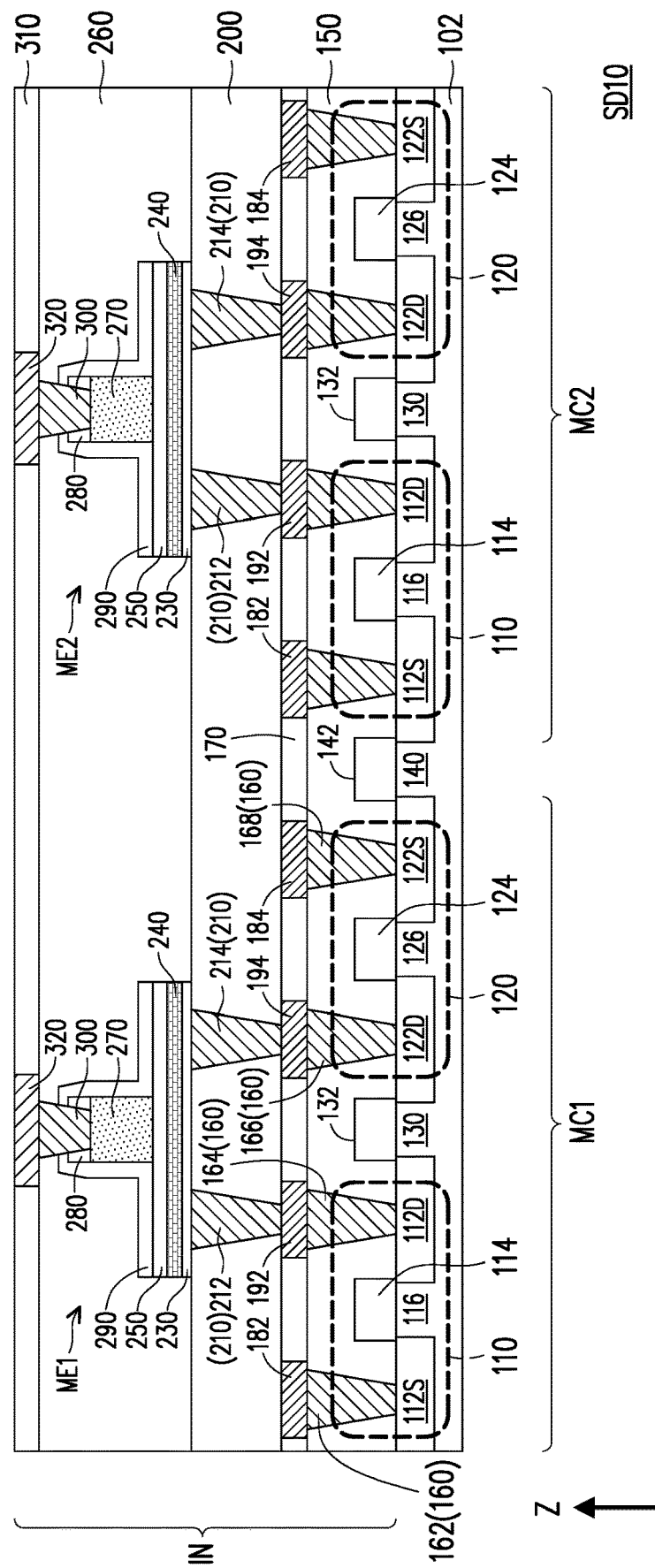
FIG. 1 is a schematic view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view of a semiconductor device SD10 according to some embodiments of the disclosure. In some embodiments, the semiconductor device SD10 includes a semiconductor substrate 102 and an interconnection structure IN formed on the semiconductor substrate 100. In some embodiments, the semiconductor substrate 102 includes one or more semiconductor materials, which may be elemental semiconductor materials, compound semiconductor materials, or semiconductor alloys. For instance, the elemental semiconductor material may include Si or Ge. The compound semiconductor materials and the semiconductor alloys may respectively include SiGe, SiC, SiGeC, a III-V semiconductor, a II-VI semiconductor, or semiconductor oxide materials. For example, the semiconductor oxide materials may be one or more of ternary or higher (e.g., quaternary and so on) semiconductor oxides, such as indium gallium zinc oxide (IGZO), indium zinc oxide (IZO), or indium tin oxide (ITO). In some embodiments, the semiconductor substrate 102 may be a semiconductor-on-insulator, including at least one layer of dielectric material (e.g., a buried oxide layer) disposed between a pair of semiconductor layers.

In some embodiments, functional circuitry may be formed in and or on the semiconductor substrate 102. For example, in FIG. 1 are illustrated transistors 110 and 120 (e.g., two active devices) formed on some regions of the semiconductor substrate 102. The transistors 110 include a pair of source and drain regions 112S, 112D embedded in the semiconductor substrate 102 and a gate structure 114 disposed in between the source and drain regions 112S, 112D on a portion of the semiconductor substrate 102 that functions as a channel region 116 of the transistor 110. In some embodiments, the source and drain regions 112S, 112D may be doped, for example with n-type materials or p-type materials. In some embodiments, the transistor 120 may also include a pair of source and drain regions 122S, 122D and a gate structure 124 disposed between the source and drain regions 122S, 122D on a portion of semiconductor substrate 102 that functions as a channel region 126 of the transistor 120. It should be noted that the disclosure does not limit the architecture of the transistors 110, 120. For example, the transistors 110, 120 may be planar field effect transistors, fin field effect transistors, gate all around transistors, or any other transistor architecture. Furthermore, different gate contact schemes, such as front-gate, back-gate, double-gate, staggered, etc., are contemplated within the scope of the disclosure. Although in FIG. 1 are illustrated transistors 110, 120 formed over the semiconductor substrate 100, other active devices (e.g., diodes or the like) and/or passive devices (e.g., capacitors, resistors, or the like) may also be formed as part of the functional circuit.

In some embodiments, the semiconductor device SD10 may be or include a memory device. For example, a memory array having a plurality of memory cells MC1, MC2 is formed in at least a region of the semiconductor device SD10. In FIG. 1, two of such memory cells MC1 and MC2 are illustrated for discussion purposes, but it will be apparent that the disclosure does not limit the number of memory cells MC1, MC2 included in the semiconductor device SD10. In some embodiments, the memory cells MC1, MC2 include paired transistors 110, 120 which may function as driving transistors for the memory cells MC1, MC2. In some embodiments, the transistors 110, 120 of a same memory cell (e.g., MC1 or MC2) are separated from each other by a portion of semiconductor substrate 102 acting as a dummy channel 130. For example, the dummy channel 130 may be located in between the drain region 112D of the transistor 110 and the drain region 122D of the transistor 120. In some embodiments, a dummy gate structure 132 may be formed on the dummy channel 130. The dummy gate structure 132 may be electrically floating with respect to the transistors 110, 120, and may be formed to improve process uniformity, without being involved in the operation of the memory cells MC1, MC2. In some embodiments, additional dummy channels 140 and dummy gate structures 142 may be located in between transistors 110, 120 of adjacent memory cells MC1, MC2. For example, the dummy channel 140 and the overlying dummy gate structure 142 are located between the source region 122S of the transistor 120 of the memory cell MC1 and the adjacent source region 112F of the transistor 110 of the memory cell MC2.

The interconnection structure IN is formed over the semiconductor substrate 102 to integrate the active and passive devices formed on the semiconductor substrate 102 in one or more functional circuits. In some embodiments, the interconnection structure IN includes alternately stacked conductive vias and conductive lines embedded in interlayer dielectrics (ILDs) that interconnect the active and passive devices formed on the semiconductor substrate 102 with each other and with additional elements which may be embedded within the interconnection structure IN. For example, memory elements ME1, ME2 are formed within the interconnection structure IN and are coupled by metallization wirings of the interconnection structure IN to the transistors 110, 120 of the corresponding memory cells MC1, MC2. For example, the memory element ME1 of the memory cell MC1 is connected to the transistors 110, 120 of the memory cell MC1, and so on.

In some embodiments, the ILD 150 extends on the semiconductor substrate 102, and the conductive vias 160 extend through the ILD 150 to contact the source and drain regions 112S, 112D, 122S, 122D of the transistors 110, 120. The conductive lines 182, 184 and the conductive patterns 192, 194 are formed over the ILD 150 to electrically couple to the transistors 110, 120. In some embodiments, the conductive vias 162 connect the conductive lines 182 to the source regions 112S of the transistors 110, the conductive vias 164 connect the conductive patterns 192 to the drain regions 112D of the transistors 110, the conductive vias 166 connect the conductive patterns 194 to the drain regions 122D of the transistors 120, and conductive vias 168 connect the conductive lines 184 to source regions 122S of the transistors 120. In some embodiments, the conductive vias 162, 164, 166, 168 may be collectively referred to as conductive vias 160. The conductive lines 182, 184 and the conductive patterns 192, 194 may be entrenched in a separate ILD 170 or in the ILD 150, depending on the manufacturing process (e.g., damascene, dual damascene, etc.) followed for their fabrication. In FIG. 1, additional conductive vias 210 extending through the ILD 200 connect the conductive patterns 192, 194, to the memory elements ME1, ME2.

In some embodiments, the semiconductor device SD10 is or includes a spin orbit transfer magnetic random access memory (SOT-MRAM), and the memory elements ME1, ME2 at least include a spin Hall electrode 240 and a magnetic tunnel junction (MTJ) 270 disposed on the spin Hall electrode 240. In some embodiments, the spin Hall electrode 240 is connected to the driving transistors 110, 120 by the conductive vias 212, 214, respectively, and the MTJ 270 is disposed on the spin Hall electrode 240 at an opposite side with respect to the conductive vias 212, 214. In some embodiments, the conductive vias 212, 214 may be collectively referred to as the conductive vias 210. In some embodiments, a conductive via 300 connects the MTJ 270 to a conductive line 320 extending over the MTJ 270 and the spin Hall electrode 240.

Figure 2:
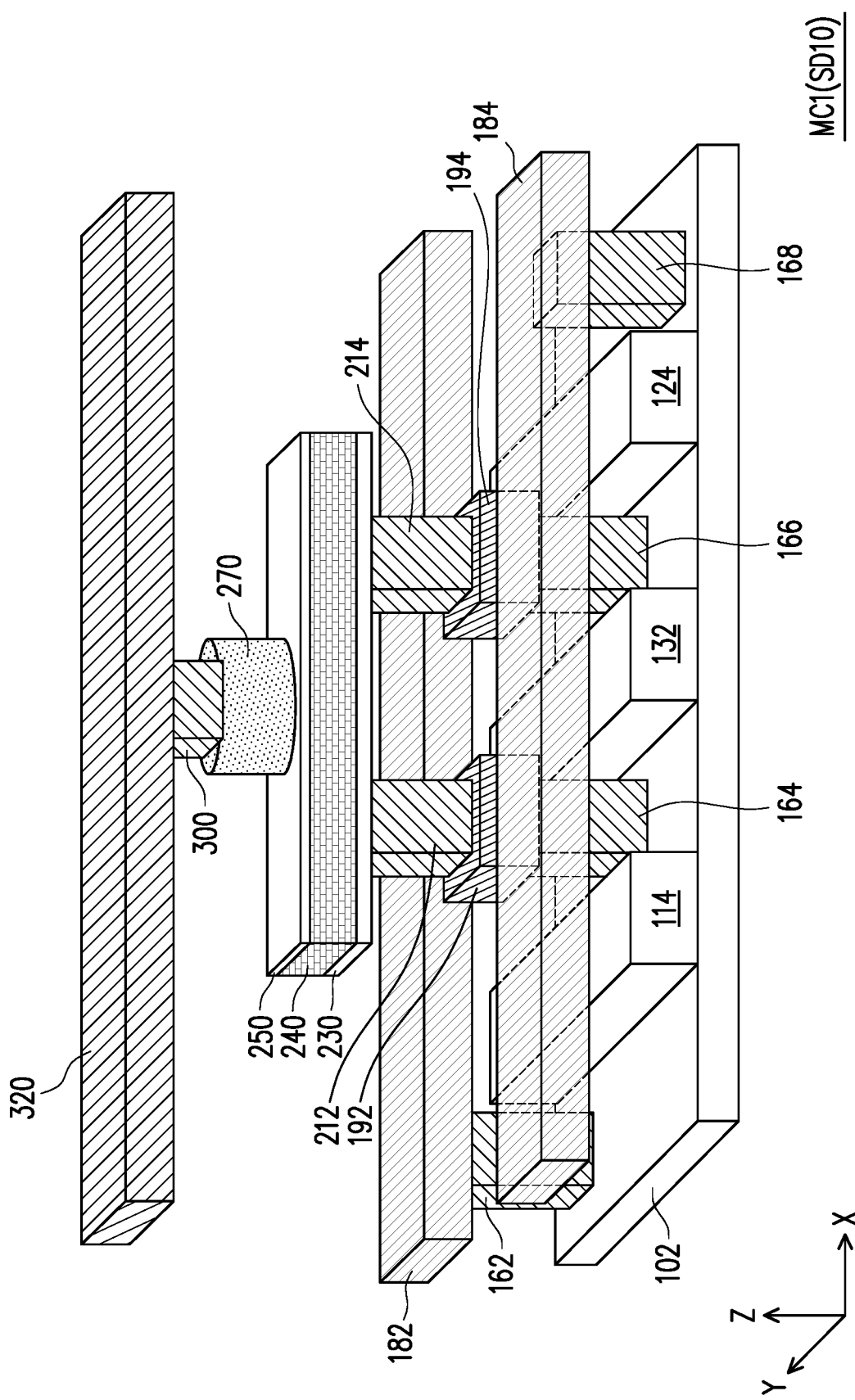
FIG. 2 is a schematic perspective view of a memory cell of a semiconductor device according to some embodiments of the disclosure.

FIG. 2 is a schematic perspective view of a memory cell (e.g., MC1) of the semiconductor device SD10 according to some embodiments of the disclosure. As can be noticed by comparison of FIG. 1 and FIG. 2, in the schematic views as the one of FIG. 1 elements belonging to different XZ or YZ planes are included for illustration purpose, while there may be no single XYZ plane in which the elements illustrated in FIG. 1 are simultaneously visible. In the following description, the directions X, Y, and Z are considered to form an orthogonal set of Cartesian coordinates.

Referring to FIG. 1 and FIG. 2, in some embodiments, the gate structures 114, 124, and the dummy gate structures 132 (and 142) extend along the Y direction, and the source and drain regions 112S, 112D, 122S, 122D are disposed at opposite sides of the corresponding gate structures 114, 124 along the X direction. The conductive lines 182, 184 may be wirings extending along the X direction, perpendicularly with respect to the gate structures 114, 124. The conductive patterns 192, 194 may be plates connecting the corresponding underlying conductive vias 164, 166 to the corresponding overlying conductive vias 212, 214. In some embodiments, the conductive vias 164, 166, 212, 214 and the conductive patterns 192, 194 may be formed in between the conductive lines 182, 184 along the Y direction. In some embodiments, the spin Hall electrode 240, the MTJ 270, and the conductive line 320 may also have an elongated shape along the X direction. In some embodiments, the memory cells MC1, MC2 are disposed according to columns and rows of an array along the X direction and the Y direction. In some embodiments, memory cells MC1, MC2 distributed along the X direction at a same level height along the Y direction may share the conductive lines 182, 184 and 320, while memory cells MC1, MC2 distributed along the Y direction at a same level height along the X direction may share the gate structures 114, 124. Each memory cell MC1, MC2 has a dedicated memory element ME1, ME2. Individual memory cells MC1, MC2 may be selectively addressed by applying voltages or reading potentials of combinations of the corresponding gate structures 114, 124 and conductive lines 182, 184, 320.

Figure 3:
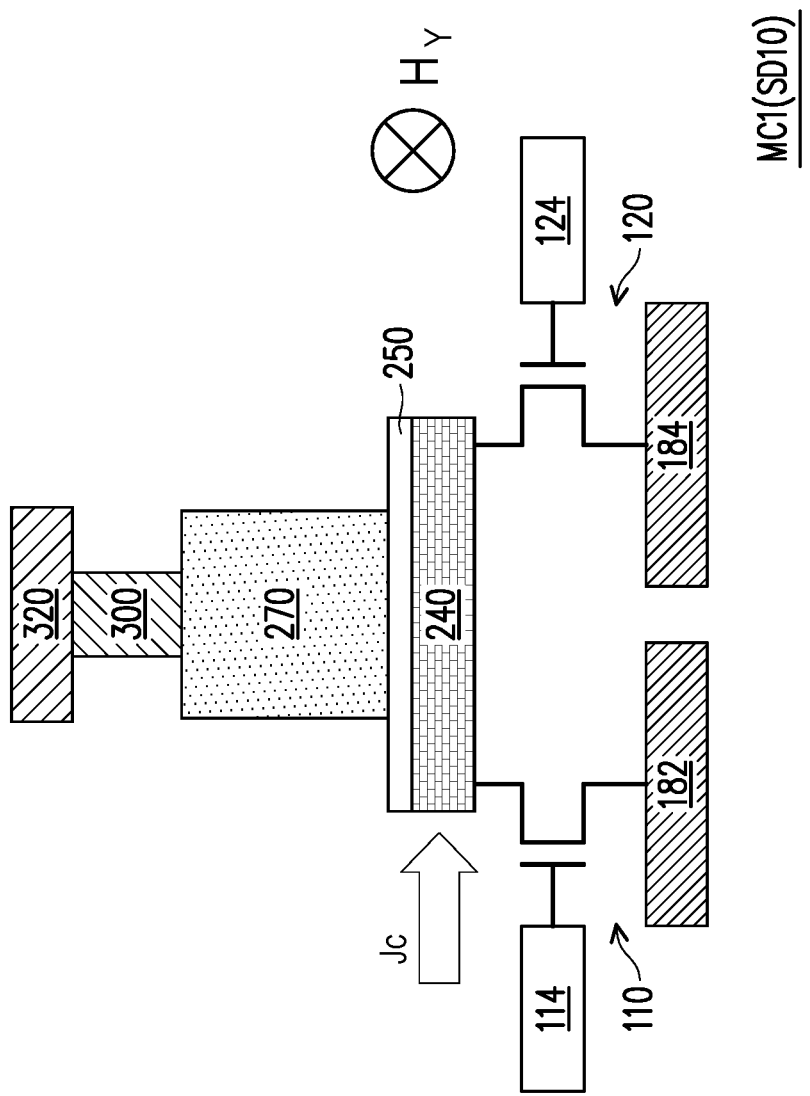
FIG. 3 is a schematic circuit view of a memory cell of a semiconductor device according to some embodiments of the disclosure.

FIG. 3 is a schematic circuit view of a memory cell MC1 of the semiconductor device SD10 according to some embodiments of the disclosure. While in the following the description focuses on the memory cell MC1, structure and operation of the memory cells MC2 may be identical. Referring to FIG. 1 and FIG. 3, in some embodiments, the memory cell MC1 includes the driving transistors 110, 120 which are connected to two terminals of the spin Hall electrode 240, on one side of the spin Hall electrode 240 at opposite ends of the spin Hall electrode 240, while the MTJ 270 is disposed on an opposite side of the spin Hall electrode 240 with respect to the driving transistors 110, 120. In some embodiments, a separation layer 250 is interposed between the spin Hall electrode 240 and the MTJ 270, and may serve as a structural buffer layer to compensate for mismatch amongst the structures of the layers of the spin Hall electrode 240. In some embodiments, the separation layer 250 may include (and, in some embodiments, be formed of) a metal material or a dielectric material. The metal material may be a non-ferromagnetic metal material, such as Ru, Pt, Mo, Ti, Mg, or a combination thereof, and the dielectric material may be a metal oxide, such as magnesium oxide, cobalt oxide, aluminum oxide, or a combination thereof.

The structure of the MTJ 270 is not particularly limited, and any known structure may be applied. In some embodiments, the MTJ 270 at least includes a magnetic layer which has a magnetic moment that can be switched by action of spin-orbit torque generated by the spin Hall electrode 240. In some embodiments, the magnetic layer may be the layer of the MTJ 270 closer to the spin Hall electrode 240, and may be separated from the spin Hall electrode 240 by the separation layer 250. In some embodiments, the MTJ 270 includes additional layers such as one or more of a barrier layer, a reference layer, a pinned layer, a capping layer, or the like.

As mentioned above, the memory cells (such as the memory cell MC1) of the semiconductor device SD10 may be operated as cells of an SOT-MRAM. In an SOT-MRAM, the magnetic moment of magnetic layer of the MTJ 270 is switched using the spin-orbit interaction effect generated by a current Jc flowing adjacent to the magnetic layer of the MTJ 270. Manipulating the magnetic layer orientation causes a resistance change of the MTJ 270, which change may be used to record a data value in the memory cells MC1. The magnetic moment of the magnetic layer may be switched by spin-orbit torque only or with an auxiliary magnetic field. There are three general types of SOT-MRAMs, classified according to the orientation relationship between the magnetization of the magnetic layer and the write current Jc flowing through the spin Hall electrode 240. An x-type SOT-MRAM has a magnetic layer moment which is parallel to the Jc current through the spin Hall electrode 240 and an auxiliary magnetic field which is perpendicular to the plane of the current flow in the spin Hall electrode 240. A y-type of SOT-MRAM has a free magnetic layer moment which is perpendicular to, but in the same plane as, the direction of the Jc current through the spin Hall electrode 240. A z-type of SOT-MRAM has a free magnetic layer moment which is perpendicular to the plane of the Jc current flowing through the spin Hall electrode 240 and an auxiliary magnetic field may be needed which is parallel to the flow of the Jc current. While in the following an x-type SOT-MRAM is discussed, the disclosure is not limited thereto, and other types of SOT-MRAMs are also contemplated within the scope of the disclosure.

As noted above, the spin Hall electrode 240 is a spin orbit active interface that has a strong spin-orbit interaction and can be used to switch the magnetic moment of the magnetic layer of the MTJ 270. The spin Hall electrode 240 is used to generate a spin-orbit magnetic field $H_Y$. More specifically, the current $J_c$ is driven in a plane (perpendicular to the Z direction) through the spin Hall electrode 240, and the spin-orbit magnetic field Hy is generated (orthogonal) to the direction of the current $J_c$. This spin-orbit magnetic field $H_Y$ is equivalent to the spin-orbit torque T exercised on the magnetization of the magnetic layer of the MTJ 270. The torque T and the magnetic field $H_Y$ are thus interchangeably referred to as spin-orbit field $H_Y$ and spin-orbit torque T. This reflects the fact that the spin-orbit interaction is the origin of the spin-orbit torque T and the spin-orbit field $H_Y$. The spin-orbit torque T occurs for the current $J_c$ driven in a plane in the spin Hall electrode 240. The spin-orbit torque T may rapidly deflect the magnetic moment of the magnetic layer of the MTJ 270 from its equilibrium state.

In some embodiments, flow of the current Jc through the spin Hall electrode 240 may be controlled through the driving transistors 110, 120, for example by applying suitable potentials to the conductive lines 182, 184 and the gate structures 114, 124. In some embodiments, the conductive lines 182, 184 may function as source lines of the memory cells MC1, the gate structures 114, 124 as word lines of the memory cells MC1, and the conductive lines 320 as bit lines of the memory cells MC1. For example, to write data in the MTJ 270, a voltage is applied such that the gate structures 114, 124 of the transistors 110, 120 are turned on. Then, a write voltage is applied to one of the conductive lines 182, 184, while the other conductive line 182 or 184 is grounded. The resulting current $J_c$ generates the spin-orbit torque T which switches the magnetization of the MTJ 270, thus recording data in the MTJ 270. By inverting the voltage applied to the conductive lines 182, 184, different data may be written in the MTJ 270. For example, when a write voltage is applied to the conductive line 182 while the conductive line 184 is grounded, the current $J_c$ flows in one direction (e.g., from the transistor 110 towards the transistor 120) through the spin Hall electrode 240, thus generating a spin-orbit torque T which sets the magnetization of the MTJ 270 to a first state, for example corresponding to "0". If the voltage between the conductive lines 182, 184 is exchanged (e.g., write voltage on the conductive line 184 with the conductive line 182 being grounded), the flow direction of the current $J_c$ in the spin Hall electrode 240 is inverted, and thus, an opposite spin-orbit torque T is applied on the MTJ 270. As a result, the MTJ 270 is switched to a second state, for example corresponding to "1". During writing operations, the conductive line 320 can be floating. For reading data from the MTJ 270, one of the transistors 110, 120 is switched off (for example, by leaving the corresponding gate structures 114, 124 floating) and the conductive line 182 or 184 connected to the active transistor 110 or 120 is grounded. By reading the potential at the conductive line 320, the state of the MTJ 270 can be calculated, and the data written in the MTJ 270 can be known.

Figure 4:
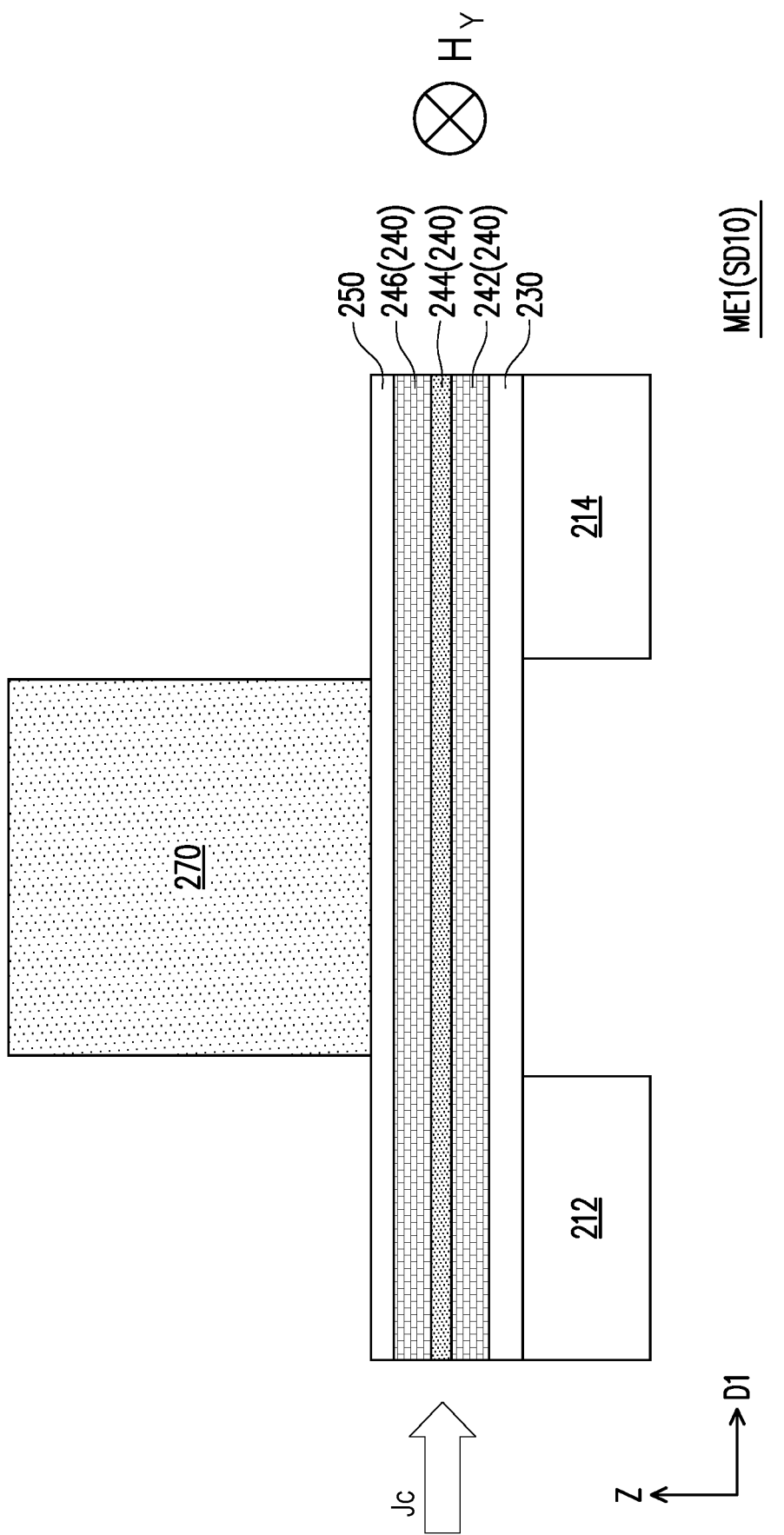
FIG. 4 is a schematic cross-sectional view of a portion of a memory cell of a semiconductor device according to some embodiments of the disclosure.

FIG. 4 is a schematic cross-sectional view of a memory element ME1 of the semiconductor device SD10 according to some embodiments of the disclosure. Referring to FIG. 1 and FIG. 4, as discussed above, the memory element ME1 may be connected to the driving transistors 110, 120 by the conductive vias 212, 214. A buffer layer 230 may optionally be interposed between the spin Hall electrode 240 and the conductive vias 212, 214. For example, the buffer layer 230 extends on the ILD 200 covering the conductive vias 212, 214, and the spin Hall electrode 240 is disposed on the buffer layer 230. The buffer layer 230 may include (and, in some embodiments, be formed of) a thin layer of insulating material, such as MgO deposited at a thickness along the Z direction in the range from about 2 Å to about 9 Å. In some embodiments, the thickness of the buffer layer 230 is such not to prevent electrical coupling between the transistors 110, 120 and the spin Hall electrode 240. The separation layer 250 and the MTJ 270 may be disposed on the spin Hall electrode 240 at an opposite side with respect to the buffer layer 230 and the conductive vias 212, 214.

In some embodiments, the spin Hall electrode 240 has a composite structure, including metal layers 242, 246 and spacer layers 244 alternately stacked. For example, the spin Hall electrode 240 of FIG. 2 includes two metal layers 242, 246 separated by the spacer layer 244. In some embodiments, the metal layer 242 is disposed directly on the buffer layer 230, the spacer layer 244 is stacked directly on the metal layer 242, and the metal layer 246 is stacked directly on the spacer layer 244 along the Z direction (a stacking direction). In some embodiments, the metal layers 242, 246 may include (or be formed of) a metallic material in which spin-orbit coupling is sufficient to produce the spin orbit field $H_Y$ for switching the magnetization of the MTJ 270 when the current $J_c$ flows through the spin Hall electrode 240. For example, the metal layers 242, 246 may include heavy metals, and may be referred to as heavy metal layers. For example, the heavy metals may be transition elements from the Period 5 or Period 6 of the periodic table having valence electrons in the 4d and 5d orbitals, such as gold, palladium, platinum, tantalum, tungsten, and the metal layers 242, 246 may include such elements or alloys thereof. In some embodiments, the metallic material included in the metal layers 242, 246 may be in a metastable state, and may tend to transform into a more stable state upon given conditions, such as increasing thickness of the metal layers 242, 246 or exposure to elevated temperatures as required during manufacturing of semiconductor devices. For example, the metallic material included in the metal layers 242, 246 may tend to transform from the metastable state into a more stable state depending on the individual thickness of the metal layers 242, 246 or upon exposure to elevated temperature. In some embodiments, the metastable state of the metallic material may have superior performances for spin Hall applications, for example because the metastable state may have higher spin Hall angle (defined as the ratio of generated spin current density to charge current density) and/or lower power consumption than the more stable state of the metallic material. The spin Hall angle generally increases with increasing thickness of the layer of metastable metallic material, so that thicker layers of the metastable metallic material would be of interest for enhanced performances of the spin Hall electrode 240. In some embodiments, by interposing spacer layers (such as the spacer layer 244) in between metastable metal layers (such as the metal layers 242, 246), the metastable metal layers 242, 246 may be stabilized, allowing increased thicknesses (and hence spin Hall angles) to be achieved for the spin Hall electrode 240. In some embodiments, the material for the spacer layer 244 may be selected taking into account the properties of the metallic material of the metal layers 242, 246. For example, when the metastable state and the stable state (states may also be referred to as phases) of the metallic material of the metal layers 242, 246 have different 3-D atomic structures (either crystalline, amorphous, or a hybrid), the 3-D atomic structure of the material of the spacer layer 244 is selected to be different from the 3-D atomic structure of the stable state of the metallic material, so as not to act as a template for the transformation of the metallic material in the metastable state. For example, the spacer layer 244 may be an amorphous layer, or have the atoms arranged according to a crystalline lattice different from the crystalline lattice of the metastable state of the metallic material of the metal layers 242, 246. For example, the spacer layer 244 may interrupt the rearrangement of the atoms of the metallic material from the metastable state to the stable state, thus slowing down or even inhibiting the transformation into the stable state. In some embodiments, the material of the spacer layer 244 may be selected so that small surface roughness after deposition can be achieved. In some embodiments, the spacer layer 244 may be deposited with a surface roughness sufficiently small such that the subsequent deposition of the materials of the MTJ 270 is not affected. For example, the surface roughness of the spacer layer 244 an arithmetical mean deviation of the surface profile (Ra) less than 0.2 nm, such as about in the range from 0.1 nm to 0.2 nm. The surface roughness of the spacer layer 244 may be measured by atomic force microscopy (AFM). In some embodiments, the material of the spacer layer 244 may include an electrical conductor or an insulator. When an insulator is used, the spacer layer 244 may be formed sufficiently thin so that electrical current is allowed to pass through. In some embodiments, the spin Hall electrode 240 may have an elongated shape along a certain direction D1 (e.g., the X direction of FIG. 2), and the cross-sectional view of FIG. 4 is taken in a plane defined by the stacking direction Z of the metal layers 242, 246 and the elongation direction D1 of the spin Hall electrode 240. In some embodiments, the bottommost metal layer 242 may be substantially formed of the metallic material in the metastable state (e.g., β-tungsten), while part of the metallic material in the upper metal layer 246 may have transformed in the stable state (e.g., α-tungsten). That is, in the upper metal layer 246, the metallic material may exist as a mixture of both the stable and the metastable state.

An example of a metallic material for the metal layers 242, 246 may be tungsten or a tungsten tantalum alloy. Tungsten may exist as metastable mixture of α-β-tungsten form, β-tungsten, or a more stable α-tungsten form. In some embodiments, the α-tungsten form has a body centered cubic crystal structure, while the β-tungsten form may have a structure intermediate between amorphous tungsten and α-tungsten (e.g., A15 cubic). In some embodiments, the mixture of α-β-tungsten has a higher spin Hall angle than α-tungsten and results in lower power consumption than the more stable α-tungsten. In some embodiments, the mixture of α-β-tungsten has a tendency to transform in α-tungsten, for example with increasing thickness of the mixture of α-β-tungsten films or when such films are exposed to elevated temperatures as may be required during manufacturing of semiconductor devices. In some embodiments, the tendency of mixture of α-β-tungsten to transform in α-tungsten may increase with increasing thickness of the corresponding layer. For example, thicker layers of mixture of α-β-tungsten may undergo transformation into α-tungsten at lower temperatures than thinner layers of mixture of α-β-tungsten. In some embodiments, when the metal layers 242, 246 include (or are formed of) mixture of α-β-tungsten, the spacer layer 244 may include (or be formed of) a material that has a different 3-D atomic structure than a-tungsten. The material of the spacer layer 244 is not particularly limited, and may include, for example, one or more metals or their oxides such as magnesium, cobalt, magnesium oxide, cobalt oxide, aluminum oxide or the like, ferromagnetic materials such as ternary mixtures of cobalt iron boron (CoFeB), cobalt palladium (CoPd), cobalt iron (CoFe), cobalt iron boron tungsten (CoFeBW), nickel iron (NiFe), magnesium cobalt (MgCo), combinations thereof, or other suitable materials. For example, the spacer layer 244 may include magnesium oxide, which has a face centered cubic crystal structure, different from the body centered cubic structure of a-tungsten and, therefore, capable of hindering or preventing transformation of mixture of α-β-tungsten of the metal layers 242, 246 to α-tungsten.

Figure 5:
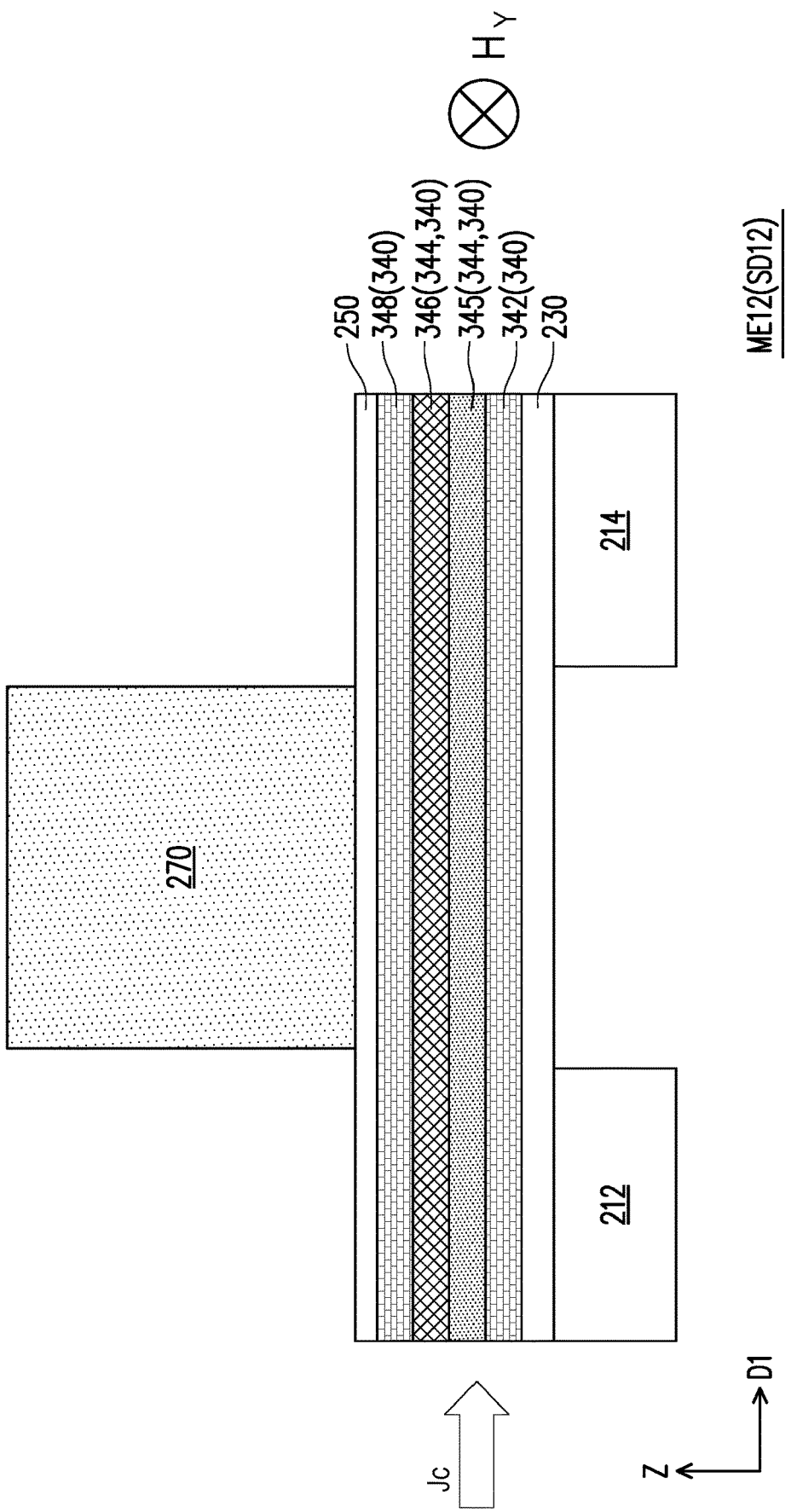
FIG. 5 and FIG. 6 are schematic cross-sectional views of memory cells of semiconductor devices according to some embodiments of the disclosure.

In some alternative embodiments, the spacer layers may have a composite structure. For example, in FIG. 5 is illustrated a cross-sectional view of a memory element ME12 of a semiconductor device SD12 according to some embodiments of the disclosure. The semiconductor device SD12 may have a similar structure as previously described for the semiconductor device SD10 of FIG. 1, and details not explicitly addressed in the following may be considered to be identical to what was previously described for the semiconductor device SD10. In some embodiments, the memory element ME12 also includes the spin Hall electrode 340 and the MTJ 270. The spin Hall electrode 340 is connected to the conductive vias 212, 214, with the buffer layer 230 optionally disposed between the spin Hall electrode 340 and the conductive vias 212, 214. The separation layer 250 may be disposed between the spin Hall electrode 340 and the MTJ 270. The spin Hall electrode 340 also includes the metal layers 342, 348, which may have similar compositions as previously described for the metal layers 242, 246 of the memory element ME1 of FIG. 4. In some embodiments, the metal layers 342, 348 include (or are formed of) a mixture of α-β-tungsten. The spacer layer 344 is disposed in between the metal layer 342, 348, similarly to what was previously described for the spacer layer 244 of FIG. 4. In some embodiments, the spacer layer 344 is a composite layer, including a layer 345 of a first material and a layer 346 of a second material having a different composition than the first material. The layer 345 is stacked on the metal layer 342, in between the metal layer 342 and the layer 346. The layer 346 is stacked on the layer 345, in between the layer 345 and the metal layer 348. In some embodiments, the material of each layer 345 or 346 may be independently selected as previously described for the material of the spacer layer 244. For example, the materials of both layer 345 and layer 346 may be selected to have a 3-D atomic structure different than the more stable state of the material of the metal layers 342, 348, so as to hinder or inhibit the transformation of the metastable material of the metal layers 324, 348 into the more stable form. For example, when the mixture of α-β-tungsten is used as material for the metal layers 342, 348, the spacer layer 344 may include the layer 345 of magnesium (having a hexagonal crystal structure) and the layer 346 of (amorphous) CoFeB. Naturally, the disclosure is not limited thereto, and other combinations of materials are contemplated within the scope of the disclosure. For example, the order of the layers 345, 346 may be switched, or different combinations of materials may be used.

Figure 6:
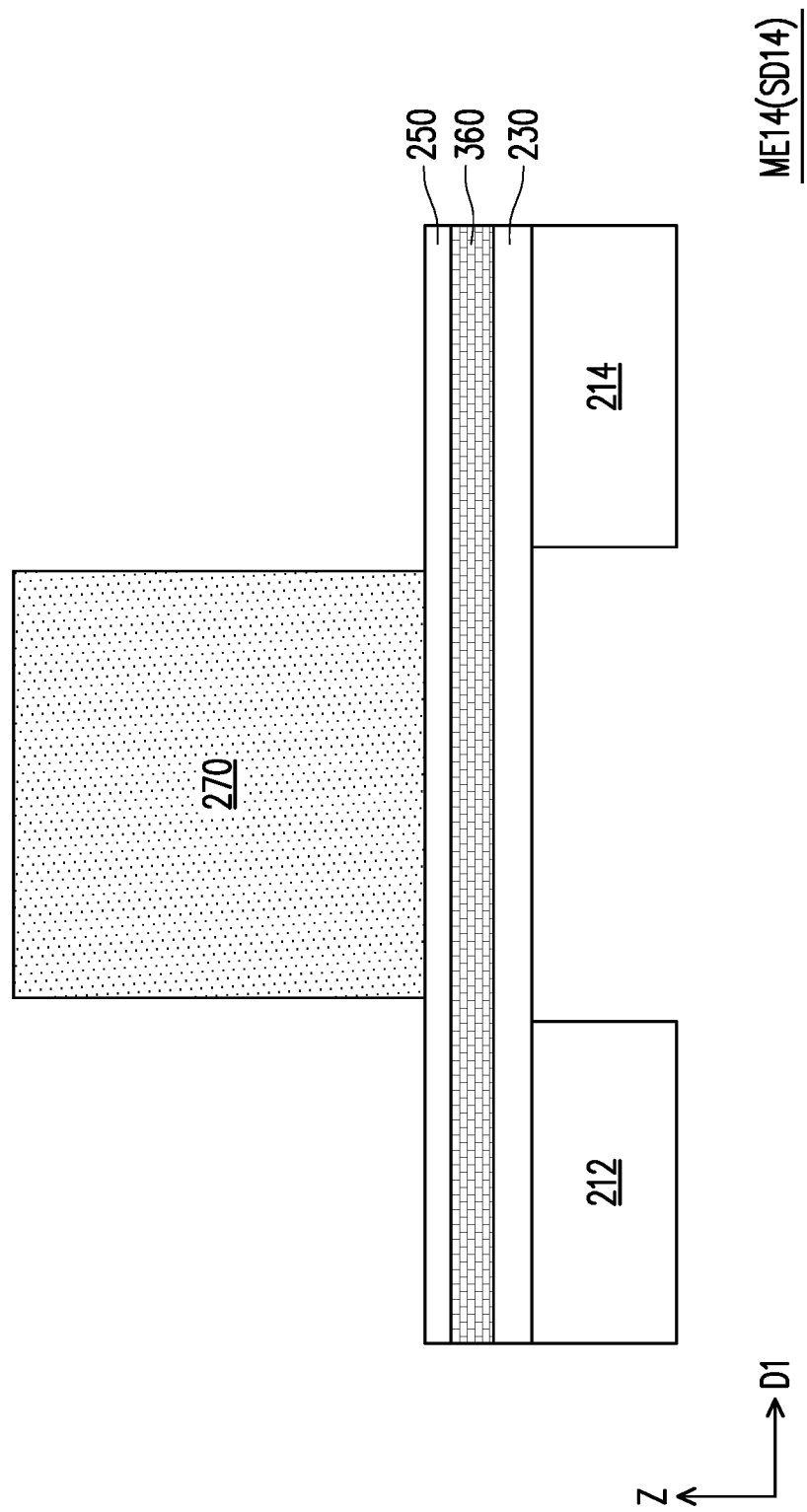

In FIG. 6 is illustrated a cross-sectional view of a memory element ME14 of a semiconductor device SD14 according to some embodiments of the disclosure. The semiconductor device SD14 may have a similar structure as previously described for the semiconductor device SD10 of FIG. 1, and details not explicitly addressed in the following may be considered to be identical to what was previously described for the semiconductor device SD10. In some embodiments, the memory element ME14 also includes the spin Hall electrode 360 and the MTJ 270. The spin Hall electrode 360 is connected to the conductive vias 212, 214, with the buffer layer 230 optionally disposed between the spin Hall electrode 360 and the conductive vias 212, 214. The separation layer 250 may be disposed between the spin Hall electrode 360 and the MTJ 270. In some embodiments, the spin Hall electrode 360 may have a simple structure, including a single metal layer without the spacer layers included in the spin Hall electrode 240 of FIG. 4 or 340 of FIG. 5. In some embodiments, the single metal layer of the spin Hall electrode 360 includes a metal material selected as the metal material of the metal layers 242, 246 of FIG. 4. For example, the spin Hall electrode 360 includes a tungsten layer, which may be initially formed as β-tungsten.

In order to characterize the spin Hall electrode 240 of FIG. 4, 340 of FIG. 5, and 360 of FIG. 6, series of the semiconductor devices SD16, SD18, and SD20 respectively illustrated in FIG. 7A to FIG. 7C were prepared. In the semiconductor devices SD16, SD18, and SD20, structures corresponding to the spin Hall electrodes 240, 340, and 360 were prepared on a substrate 400. The substrate 400 included silicon, and an oxide layer 410 about 200 nm thick was produced by way of thermal oxidation. Individual semiconductor devices SD16 such as the ones of FIG. 7A were prepared on the same substrate 400. In some embodiments, a semiconductor wafer was used as the substrate 400.

In the semiconductor devices SD16 of FIG. 7A, spin Hall electrodes 420 were prepared having a structure as previously described for the spin Hall electrode 240. First, a metal layer was formed on the oxide layer 410, by depositing tungsten. Tungsten for the metal layer was deposited by sputtering (e.g., DC sputtering), applying a power of about 50 W to a tungsten target. The resulting metal layer had a wedged profile (e.g., gradually decreasing thickness) along a direction perpendicular to the direction of the applied current flow, so as to allow for simultaneous preparation of a series of semiconductor device SD16 having different thicknesses of the metal layers 422, 426. Thereafter, the spacer layers 424 of the semiconductor devices SD16 were formed on the metal layers 422, by depositing a layer of magnesium oxide of thickness T424. A second deposition of tungsten in the same conditions indicated above was performed to form another wedged metal layer of variable thickness. That is, semiconductor devices SD16 having metal layers 422, 426 of different thicknesses T422, T426 were prepared corresponding to different regions of the wedged metal layers. Deposition conditions of the tungsten of the metal layers 422, 426 were selected to favor deposition of a mixture of α-β-tungsten. An annealing step (vacuum at about $10^{-6}$ Torr, in-plane magnetic field, 1 Tesla, 400° C., 30 min) was performed after deposition of the topmost metal layer 426.

Several semiconductor devices SD16 were thus prepared having metal layers 422, 426 presenting different total thicknesses (T422+T426) on different regions of the substrate 400. Such regions of different thicknesses allow probing the effect of the total thicknesses of the metal layers 422, 426 in individual semiconductor devices SD16 according to the structure of FIG. 7A. The thicknesses T422, T426 were varied between different semiconductor devices SD16 prepared on the same substrate 400, while within an individual semiconductor device SD16 the metal layers 422, 426 were prepared to have the same thicknesses T422, T426. In all the semiconductor devices SD16, the thickness T424 of the spacer layer 424 was set to be 0.7 nm.

Several semiconductor devices SD18 of FIG. 7B were prepared following a process substantially similar to the one described above for the semiconductor devices SD16. The tungsten metal layers 442 were formed as described above for the metal layers 422. Then, a magnesium (Mg) layer 445 of the spacer layer 444 was deposited on the metal layer 442. Subsequently, a $Co_{20}Fe_{60}B_{20}$ layer 446 of the spacer layer 444 and the mixture of α-β-tungsten metal layer 448 were sequentially deposited on the Mg layer 445 as previously described for the spacer layer 424 and the metal layer 426, respectively. Finally, the structures were annealed (vacuum at about $10^{-6}$ Torr, in-plane magnetic field, 1 Tesla, 400° C., 30 min). Multiple semiconductor devices SD18 having different total thicknesses (T442+T448) of the metal layers 442, 448 were prepared on the same substrate 400, as previously described for the semiconductor device SD16. In the semiconductor device SD18, the spacer layer 444 had a uniform thickness T444 of about 1.35 nm, with the thickness T446 of the $Co_{20}Fe_{60}B_{20}$ layer 446 being about 0.8 nm, and the thickness T445 of the magnesium oxide layer 445 being about 0.55 nm.

Several semiconductor devices SD20 of FIG. 7C were prepared by depositing the mixture of α-β-tungsten metal layers of differing thickness T460 to form the spin Hall electrodes 460 on the oxide layer 410. The deposition conditions of the tungsten were as previously described for the metal layers 422, 426 of FIG. 7A. Same annealing conditions as previously described (vacuum at about $10^{-6}$ Torr, in-plane magnetic field, 1 Tesla, 400° C., 30 min) were applied.

The semiconductor devices SD16, SD18, and SD20 prepared as described above were tested to assess the stability of the corresponding structures following the annealing step and to measure the sheet resistance Rs, the resistivity ρ, and the spin Hall angle α. The sheet resistance Rs was measured by a 4-point probe method, and the resistivity ρ was then derived by taking the thickness into account. The spin Hall angle α was measured by using patterned Hall-bar devices by ST-FMR (Spin Torque FerroMagnetic Resonance). Thickness-dependent tungsten layer structure in the metal layers 422, 426 was identified by observing X-rays diffraction patterns (Cu Kα X-ray, grazing incident angle 0.5 deg, 2 theta 20-80 deg, 0.06 deg/step, 4 sec/step) of the annealed semiconductor device SD16, to determine whether the mixture of α-β-tungsten form of the metal layers 422, 426 survived or rather transformed in the α-tungsten form.

Figure 8A:
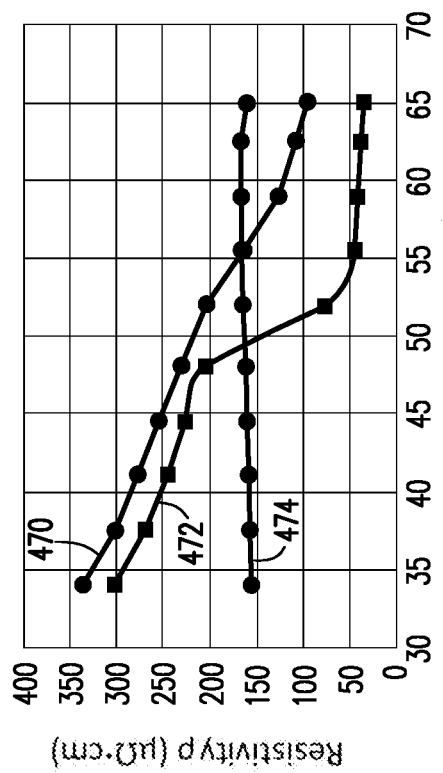
FIG. 8A to FIG. 10C are charts plotting characterization data of some semiconductor devices according to some embodiments of the disclosure.
Figure 8B:
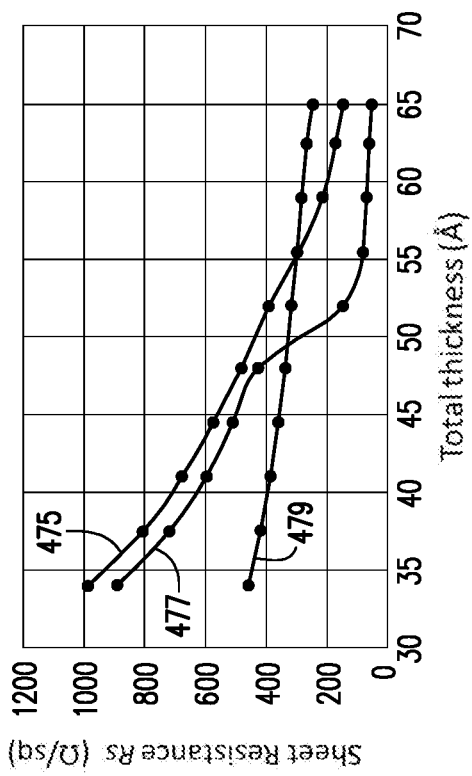
Figure 9:
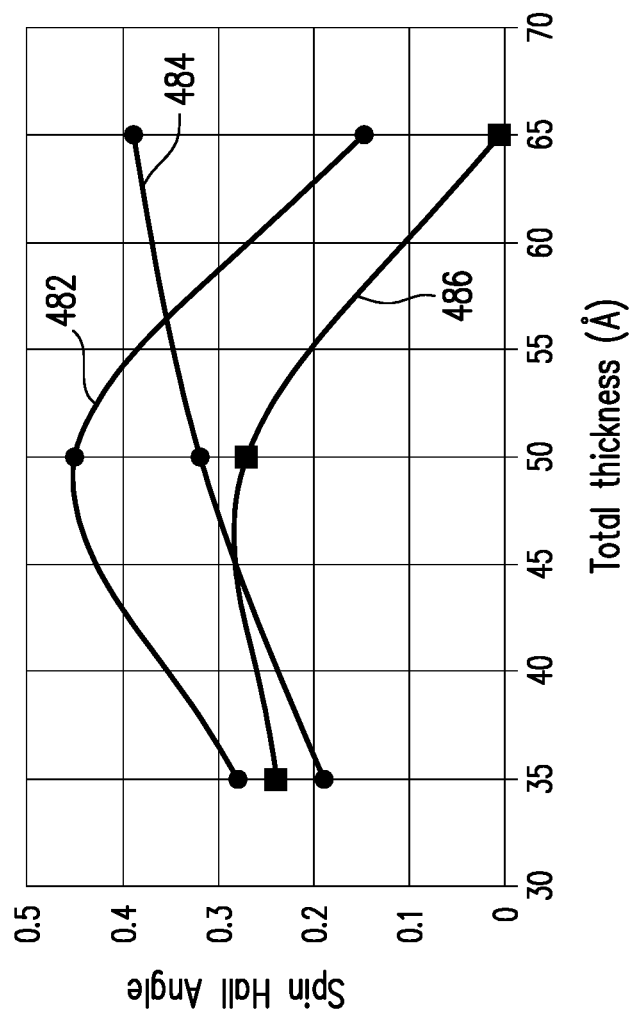

The results of the above tests are reported in the charts of FIG. 8A to FIG. 10C. In the charts of FIG. 8A to FIG. 9 and in the following discussion, the total thickness plotted on the X axes refers to the combined thickness (T422+T426, T442+T448, or T460) of the corresponding metal layers 422, 426, 442, 448, or 460 of the semiconductor devices SD16, SD18, and SD20, without taking into account the thicknesses T424, T444 of the spacer layers 424, 444. For example, for the semiconductor devices SD16, the total thickness plotted in the chart of FIG. 8A corresponds to the summed thicknesses T422 and T426 of the metal layers 422, 426, and differs from the thickness T420 of the spin Hall electrode 420 for not including the thickness T424 of the spacer layer 424. Similarly, for the semiconductor devices SD18, the total thickness plotted in the chart of FIG. 8A corresponds to the summed thicknesses of T442, T448 of the metal layers 442, 448, and differs from the thickness T440 of the spin Hall electrode 440 for not including the thickness T444 of the spacer layer 444. For the semiconductor devices SD20, the total thickness plotted in the chart of FIG. 8A corresponds to the thickness T460 of the single metal layer forming the spin Hall electrode 460. Semiconductor devices SD16, SD18, and SD20 having corresponding total (metal) thicknesses T422+T426, T442+T448, or T460 of about 34 Å, 37.5 Å, 41 Å, 44.5 Å, 48 Å, 52 Å, 55.5 Å, 59 Å, 62.5 Å, and 65 Å, were prepared and tested.

In FIG. 8A and FIG. 8B are respectively plotted the measured resistivity ρ and sheet resistance Rs for the semiconductor devices SD16, SD18, and SD20. The data series 470 in FIG. 8A and 475 in FIG. 8B were measured for the semiconductor devices SD16, the data series 472 in FIG. 8A and 477 in FIG. 8B were measured for the semiconductor devices SD20, and the data series 474 in FIG. 8A and 479 in FIG. 8B were measured for the semiconductor devices SD18. In some embodiments, the resistivity ρ and the sheet resistance Rs drops sharply for the semiconductor devices SD20 when the total thickness T460 of the single metal layer of the spin hall electrode 460 exceeds about 50 Å, suggesting that the originally deposited mixture of α-β-tungsten turns into the more stable α-tungsten upon annealing films thicker than about 50 Å. By contrast, when a spacer layer 424 or 444 is introduced as in the semiconductor devices SD16 and SD18, the transformation of the mixture of α-β-tungsten into α-tungsten may be delayed or even halted. In the data series for the semiconductor devices SD16 including the simple spacer layer 424, the resistivity ρ and the sheet resistance Rs are generally higher and the rates of change of the resistivity ρ and the sheet resistance Rs with the total thickness T422+T426 of the metal layers 422, 426 are smaller than the corresponding values observed for the semiconductor devices SD20. That is, by including the spacer layer 424 in the semiconductor devices SD16, the transition from the mixture of α-β-tungsten to α-tungsten is at least partially hindered, allowing fabrication of spin Hall electrodes 420 of greater total thickness T422+T426 of the metal layers 422, 426. When the composite spacer layer 444 is included in the semiconductor devices SD18, the resistivity ρ stays substantially constant within the measured range of the total thickness T442+T448, and the sheet resistance Rs has a significantly smaller rate of change than the one observed for the semiconductor devices SD20, suggesting that the composite spacer layer 444 may be particularly effective in stabilizing the structure of the metal layers 422, 428 in the semiconductor device SD18. In some embodiments, the transformation of the mixture of α-β-tungsten in α-tungsten may be (completely) halted in spin Hall electrodes 440 comprising a composite spacer layer 444.

The above observations are further confirmed by the data plotted in FIG. 9 for the measured spin Hall angle α. In FIG. 9, the data series 482 was measured for the semiconductor devices SD16, the data series 484 was measured for the semiconductor devices SD18, and the data series 486 was measured for the semiconductor devices SD20. From the data of FIG. 9 it can be seen how the composite spin Hall electrodes 420 and 440 have enhanced spin Hall angles α independently of the structure of the spacer layer 424 or 444, reaching spin Hall angles α as high as 0.45, and, more generally, higher than the semiconductor device SD20 having the thickest layer of the mixture of α-β-tungsten, at about 50 Å.

Figure 10A:
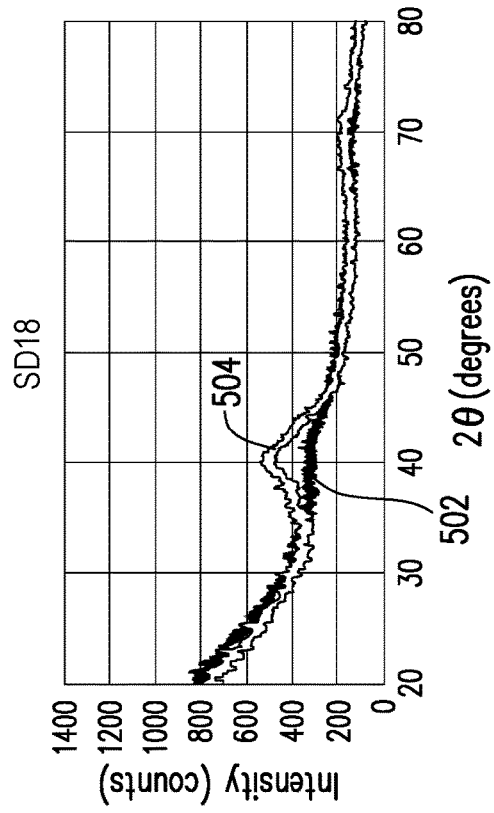
Figure 10B:
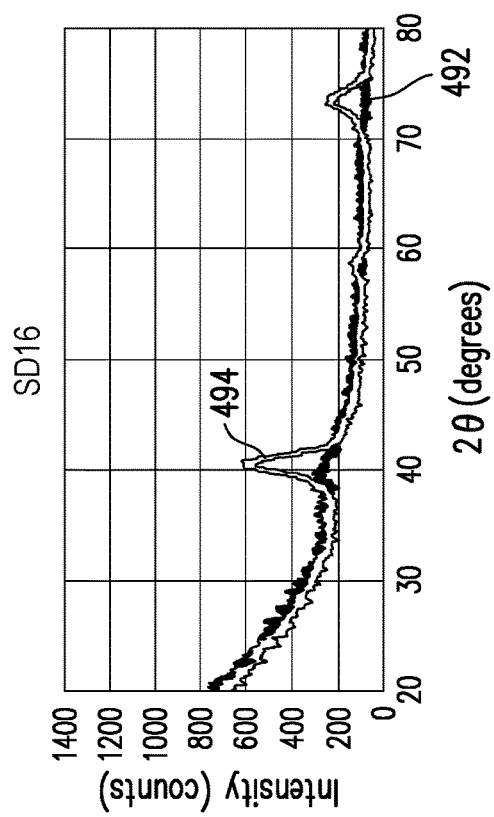
Figure 10C:
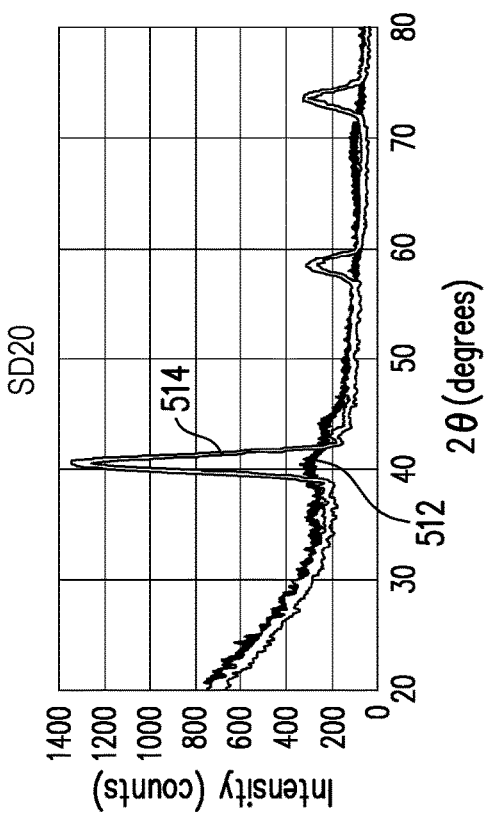

The enhanced stability of the mixture of α-β-tungsten layers in the semiconductor devices SD16 and SD18 is further confirmed by the X-ray diffraction patterns plotted in FIG. 10A to FIG. 10C. The data of FIG. 10A were measured for semiconductor devices SD16 having a total thickness T422+T426 of the metal layers 422, 426 of about 38 Å (line 492) and 63 Å (line 494); the data of FIG. 10B were measured for semiconductor devices SD18 having a total thickness T442+T448 of the metal layers 442, 448 of about 38 Å (line 502) and 63 Å (line 504); the data of FIG. 10C were measured for semiconductor devices SD20 having a thickness T460 of 38 Å (line 512) and 63 Å (line 514). From FIG. 10A to FIG. 10C it can be seen how in the smaller thickness data 492, 502, 512 the peak pattern of the crystalline α-tungsten is substantially lacking for all semiconductor devices SD16, SD18, SD20, while, for the larger thickness data 514, the semiconductor device SD20 displays prominent peaks due to the crystalline α-tungsten. On the other hand, α-tungsten peaks are barely visible for the thicker semiconductor devices SD16 including the simple spacer layer 424 (line 494) and are substantially absent for the thicker semiconductor devices SD18 including the composite spacer layer 444. That is, also the X-ray diffraction analysis confirms that the simple spacer layer 424 of the semiconductor devices SD16 at least enhance the stability of thicker mixture of α-β-tungsten layers, while the composite spacer layer 444 of the semiconductor devices SD18 may stabilize further or even entirely halt the transformation of mixture of α-β-tungsten in α-tungsten.

Based on the above, the spin Hall electrodes 240 of FIG. 4 (or 420 of FIG. 7A) and 340 of FIG. 5 (or 440 of FIG. 7B) including simple spacer layers 244 (or 424) or composite spacer layers 344 (or 444) may be obtained with total thickness of the spin Hall metastable material (e.g., mixture of α-β-tungsten) greater than 5 nm, may be capable of withstanding annealing conditions, and may display spin Hall angles α even greater than 0.4. In some embodiments, the individual thicknesses of the metal layers 242, 246 or 342, 348 may be in the range from about 1 nm to about 4 nm, and the individual thicknesses of the spacer layers 244, 344 may be in the range corresponding to the thickness of one monolayer of spacer material (e.g., one monolayer of magnesium or magnesium oxide, 0.07-0.3 nm; or one quarter monolayer of CoFeB, about 0.05 nm; or one quarter of monolayer Co, 0.07-0.13 nm) to several (e.g. in the range from 3 to 8) monolayers of spacer materials (e.g., four monolayers of magnesium oxide, about 0.8 nm to 1.3 nm; for monolayers of magnesium, about 1 nm, or about six monolayers of CoFeB, about 0.86 nm, or four monolayer of Co, about 1-2 nm).

Figure 11:
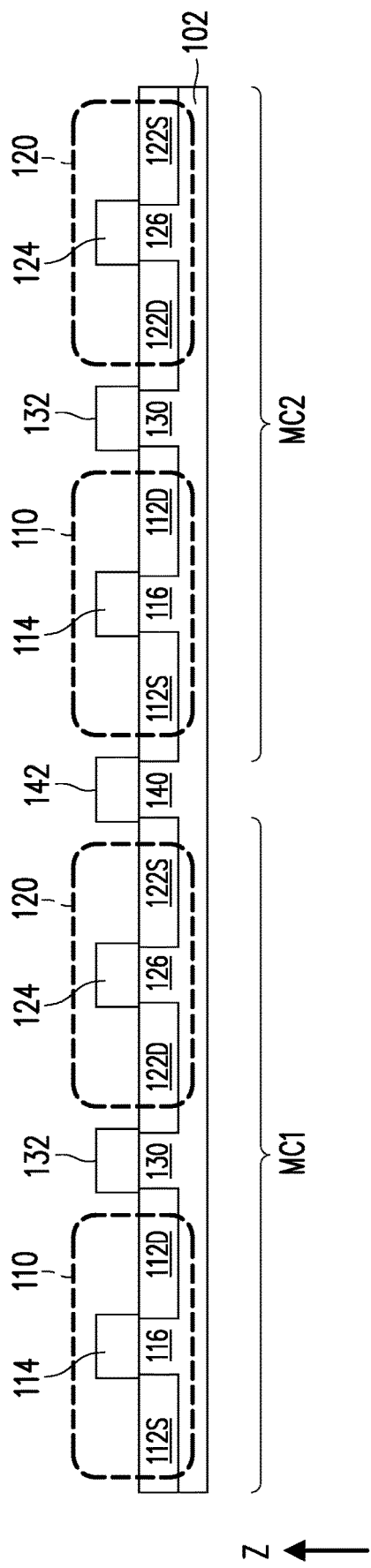
FIG. 11 to FIG. 20 are schematic views of structures produced during manufacturing of a semiconductor device according to some embodiments of the disclosure.

FIG. 11 to FIG. 20 are schematic views illustrating structures formed during a manufacturing process of semiconductor devices such as the semiconductor device SD10 of FIG. 1 according to some embodiments of the disclosure. In FIG. 11 is illustrated the semiconductor substrate 102 having the transistors 110, 120 formed thereon. The substrate 102 may be patterned to have microstructures such as fins, slabs, etc. formed thereon, for example according to the intended architecture for the transistors 110, 120. Similarly, the transistors 110, 120 may be formed according to any suitable manufacturing process, such as gate-first processes or gate-last processes. The gate structures 114, 124, as well as the dummy gate structures 132, 142 may include one or more spacers, as well as adhesion layers, interface layers, high-k dielectric layers, work-function adjustment layers, gate electrodes, etc., according to circuit requirements. The disclosure does not limit the structures of the transistors 110, 120.

Figure 12:
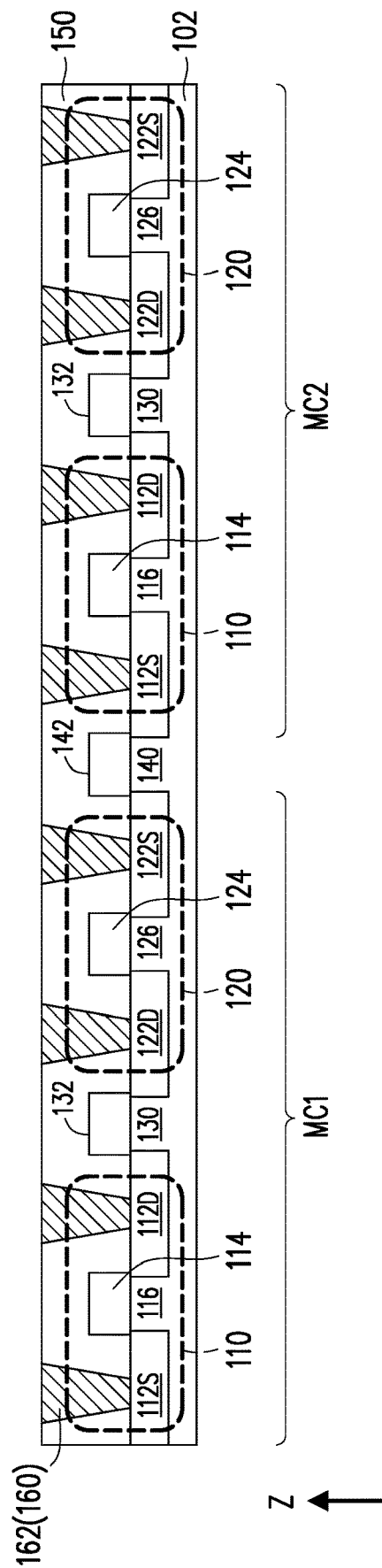

In FIG. 12, the ILD 150 is formed over the substrate 102, initially burying the transistors 110, 120. The ILD 150 may include low-k dielectric materials, such as Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. In some embodiments, the ILD 150 may be fabricated to a suitable thickness by flowable CVD (FCVD), CVD, HDPCVD, SACVD, spin-on, sputtering, or other suitable methods. In some embodiments, the ILD 150 may be formed during multiple steps and be constituted by two or more layers which may include the same or different dielectric materials. The ILD 150 is patterned to form openings exposing at their bottom the source and drain regions 112S, 112D, 122S, 122D of the transistors 110. Additional openings may also be formed exposing the gate structures 114, 124. The openings of the ILD 150 are then filled of conductive material to form the conductive vias 160. In some embodiments, the conductive material of the conductive vias 160 includes aluminum, titanium, copper, nickel, tungsten, and/or alloys thereof, and may be fabricated through a sequence of deposition (e.g., CVD, plating, or other suitable processes) and planarization steps (e.g., chemical mechanical polishing).

Figure 13:
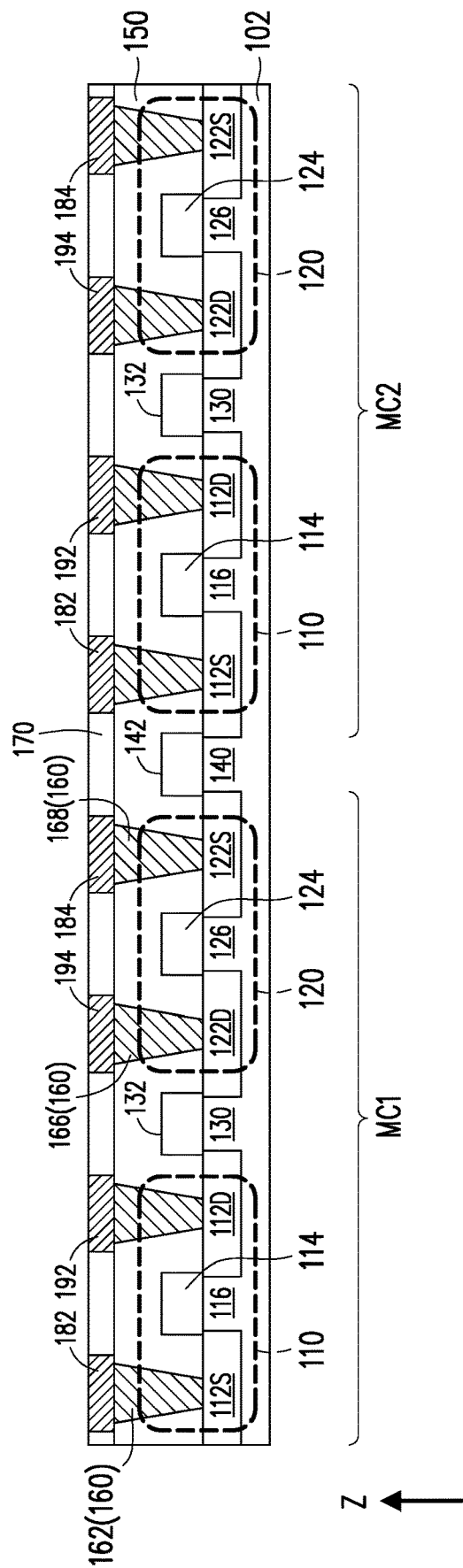

In FIG. 13, the conductive lines 182, 184 and the conductive patterns 192, 194 are formed over the corresponding conductive vias 160. The ILD 170 may be formed including similar materials and according to similar processes as the ILD 150, and may embed the conductive lines 182, 184 and the conductive patterns 192, 194. In some embodiments, the ILD 170 may be formed first, including openings exposing at their bottom the conductive vias 160. Such openings are then filled of conductive material to form the conductive lines 182, 184, and the conductive patterns 192, 194. In some alternative embodiments, the conductive lines 182, 184, and the conductive patterns 192, 194 may be formed first, for example by disposing the conductive material over the ILD 150 and the conductive vias 160, patterning said conductive material, and then disposing the material of the ILD 170. In some embodiments, the ILDs 150 and 170 are formed together, and the conductive lines 182, 184, and conductive patterns 192, 194 are integrally formed with the corresponding conductive vis 160. In general, the position (in terms of level height with respect to the semiconductor substrate 102) of the boundaries between the ILDs (e.g., 150, 170) may depend on the process followed for the formation of the interconnection structure IN.

Figure 14:
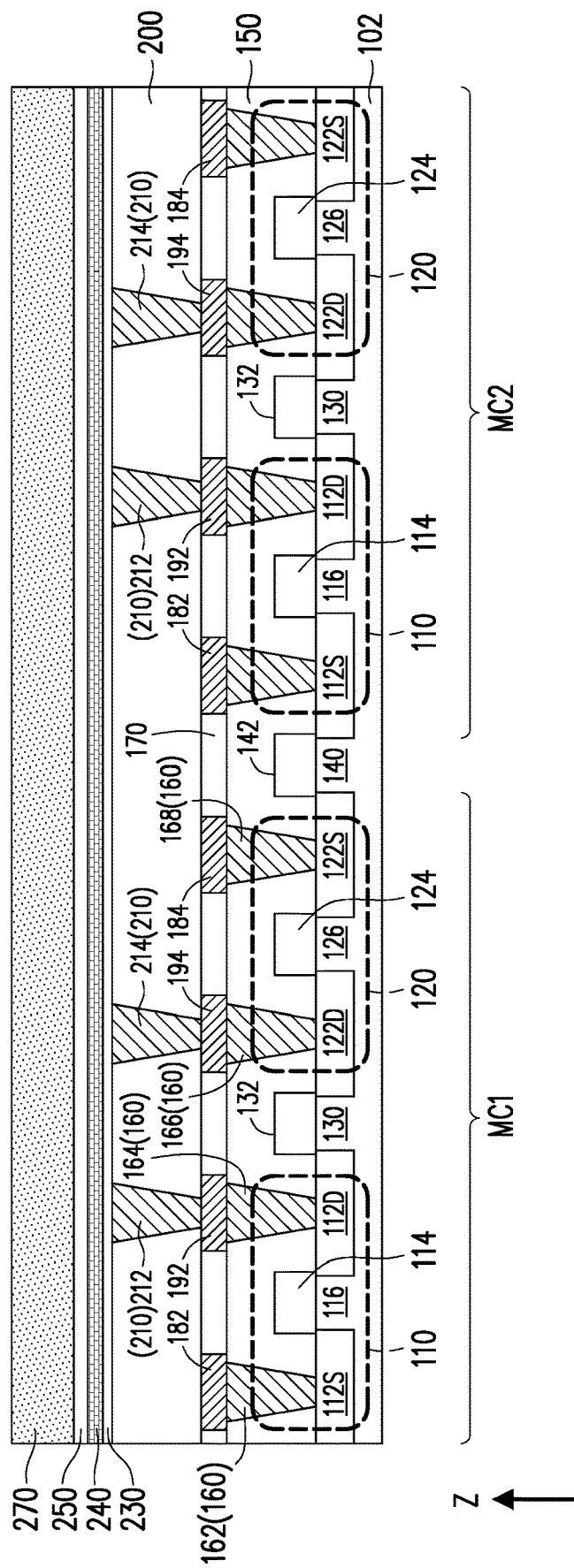

In FIG. 14, additional ILD 200 and conductive vias 210 are formed, following similar processes and materials as previously described for the ILD 150 and the conductive vias 160, respectively. Thereafter, precursor layers of the memory elements ME1, ME2 (illustrated, e.g., in FIG. 1) are deposited on the ILD 200 and the conductive vias 210, forming a layer stack blanketly covering the ILD 200. For example, the buffer layer 230 may be initially formed all over the ILD 200, spanning the area where multiple memory cells MC1, MC2 are to be formed. In some embodiments, the buffer layer 230 may be formed by suitable deposition processes, such as CVD, PVD, ALD, or the like. In some embodiments, the buffer layer 230 may include magnesium oxide or other suitable materials, deposited to a thickness about in the range from 0.2 to 0.9 nm. The layers of the spin Hall electrode 240 may then be sequentially deposited, for example following process as previously described with respect to the semiconductor device SD16 of FIG. 7A or, if composite spacer layers are desired, following processes as previously described with respect to the semiconductor device SD18 of FIG. 7B. The material of the separation layer 250 may then be formed on the spin Hall electrode 240, and, thereafter, the layers of the MTJ 270 may be formed on the separation layer 250. In the structure illustrated in FIG. 14, the layers of the spin Hall electrode 240 and of the MTJ 270 (as well as the separation layer 250, if included), span the area where the memory cells MC1, MC2 are to be formed.

In some embodiments, an annealing step may be performed. In some embodiments, the annealing step may be performed with an in-situ perpendicular magnetic field to increase the perpendicular magnetic anisotropy of the annealed layers. In some embodiments, the annealing step may be performed with an in-situ horizontal magnetic field to increase the in-plane magnetic anisotropy of the annealed layers. In some embodiments, the layers of the spin Hall electrode 240 and the MTJ 270 are deposited before performing a common annealing step. In some embodiments, maintaining the vacuum during deposition of the spin Hall electrode 240 and the MTJ 270 may result in higher quality interfaces between the deposited layers. In some embodiments, the spin Hall electrode 240 has a composite structure including a spacer layer such as the spacer layer 244 of FIG. 4 or 344 of FIG. 5. Therefore, even when metal layers (e.g., 242, 246 of FIG. 4, or 342, 348 of FIG. 5) of the spin Hall electrode 240 include a metastable spin Hall material, the metastable material may endure the annealing step without transforming or with limited transformation into more stable forms.

Figure 15:
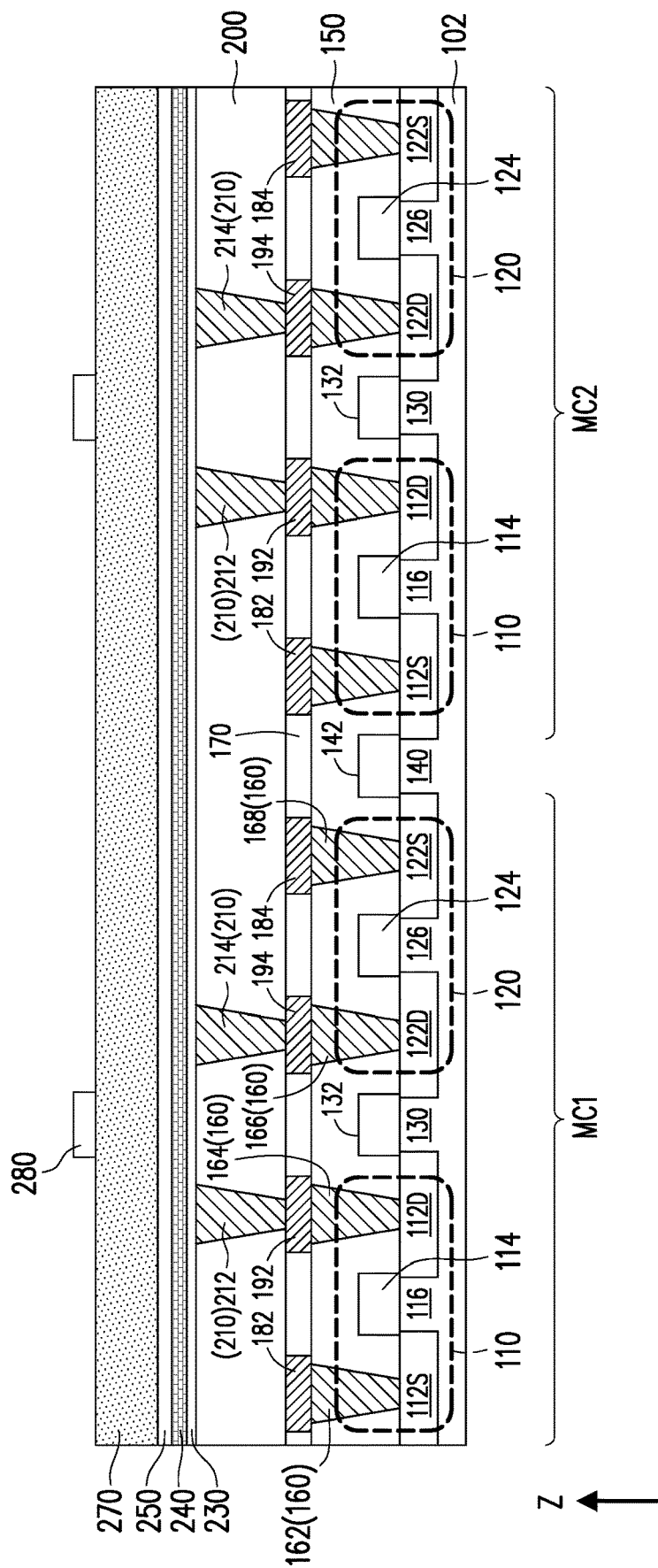

In FIG. 15, a hard mask 280 is formed on the topmost layer of the MTJ 270. The hard mask 280 may be deposited using any suitable process and may be made of any suitable material. For example, the hard mask 280 may include dielectric materials such as silicon oxide, silicon nitride, or silicon oxynitride, or conductive materials, such as tantalum, tungsten, or titanium nitride, or combinations thereof. In some embodiments, the hard mask 280 may include multiple layers, in which the upper layers are used to define the patterns of the lower layers (e.g., the layers extending closer to the MTJ 270). In some embodiments, a lower layer of the hard mask 280 may include tantalum, and an upper layer of the hard mask 280 may include silicon nitride, but the disclosure is not limited thereto, and other suitable combinations of materials may be used as required.

Figure 16:
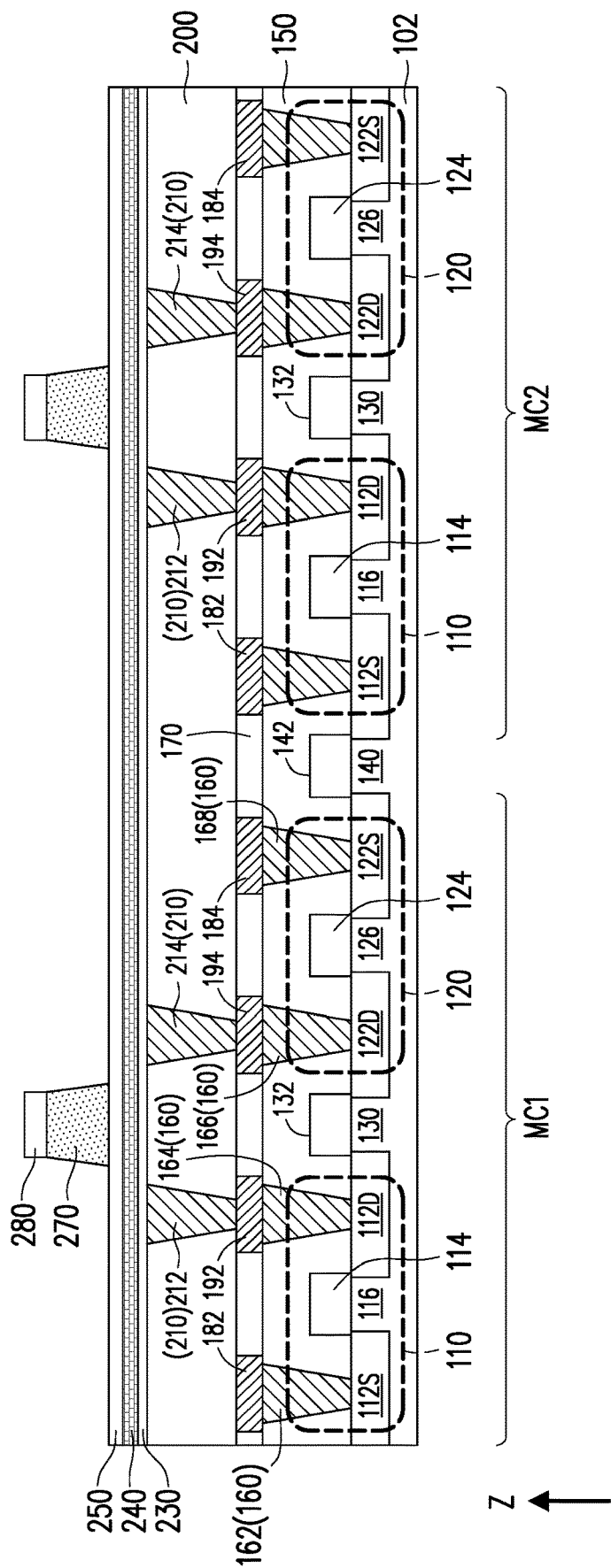

Referring to FIG. 15 and FIG. 16, the pattern of the hard mask 280 is transferred to the layers of the MTJ 270, for example during one or more etching step. The etching may be any acceptable etch process, such as wet or dry etching, a reactive ion etch (RIE), neutral beam etch (NBE), inductively coupled plasma etch (ICP), ion-beam etch (IBE), the like, or a combination thereof. The etching may be anisotropic. Following the patterning of the layers of the MTJ 270, a plurality of MTJs 270 are formed in correspondence of the intended locations of the memory cells MC1, MC2. In some embodiments, the MTJs 270 may have tapered sidewalls, depending on the patterning conditions. In some embodiments, the hard masks 280 may remain on the MTJs 270 even after the patterning step. In some embodiments, the etching of the layers of the MTJ 270 stops on the separation layer 250. In some alternative embodiments, the etching may extend through the separation layer 250 and even allow partial recess into the layers of the spin Hall electrode 240.

Figure 17:
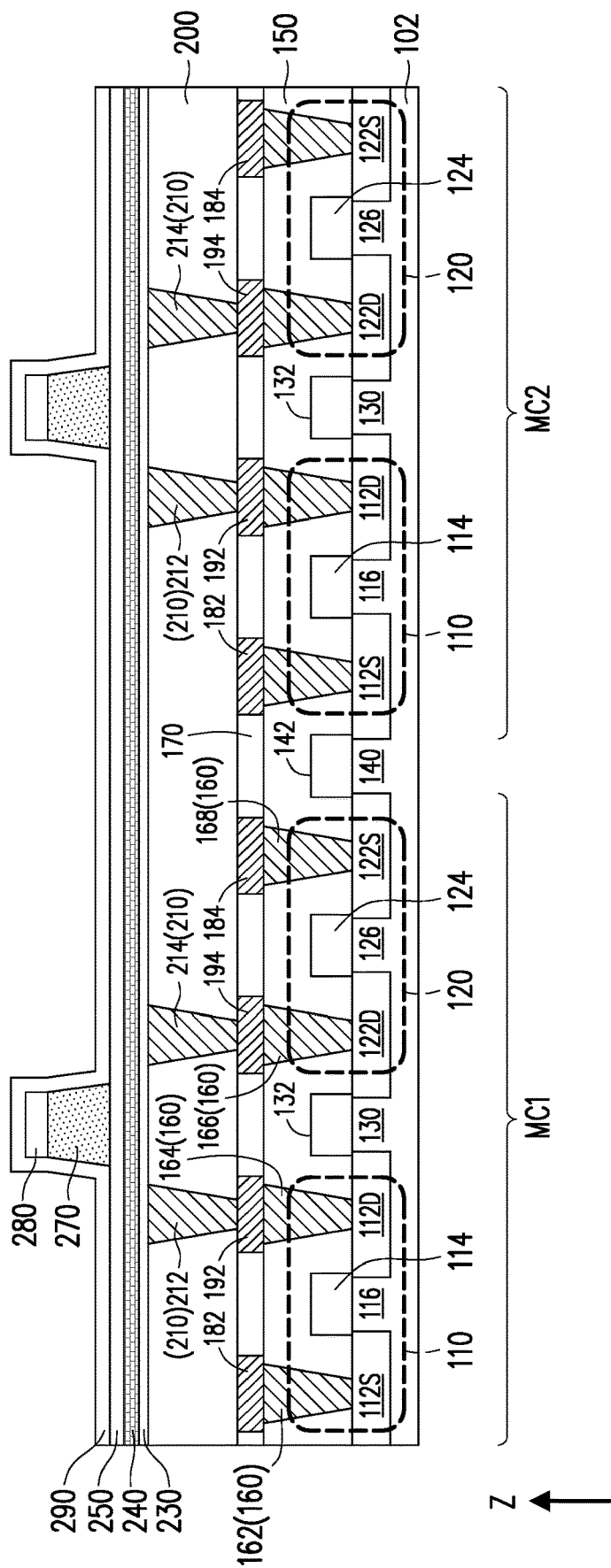

In FIG. 17, a protective layer 290 is blanketly deposited over the patterned MTJs 270 and the overlying hard masks 280. In some embodiments, the protective layer 290 blanketly extends throughout the area where the memory cells MC1, MC2 are to be formed. In some embodiments, the protective layer 290 extends on the separation layer 250 (if included) which was exposed following the patterning of the MTJs 270, and conformally covers the sidewalls of the MTJs 270. In some embodiments, the protection layer 290 includes a dielectric material such as silicon carbide, silicon oxycarbide, silicon nitride, silicon oxide, silicon oxynitride, silicon carboxynitride, or other suitable dielectric materials. In some embodiments, the protective layer 290 is formed using any suitable deposition technique, such as PVD, CVD, ALD, the like, or a combination thereof. In some embodiments, the protection layer includes silicon nitride formed by CVD. In some embodiments, oxides produced by less reactive methods such as PVD may also be used.

Figure 18:
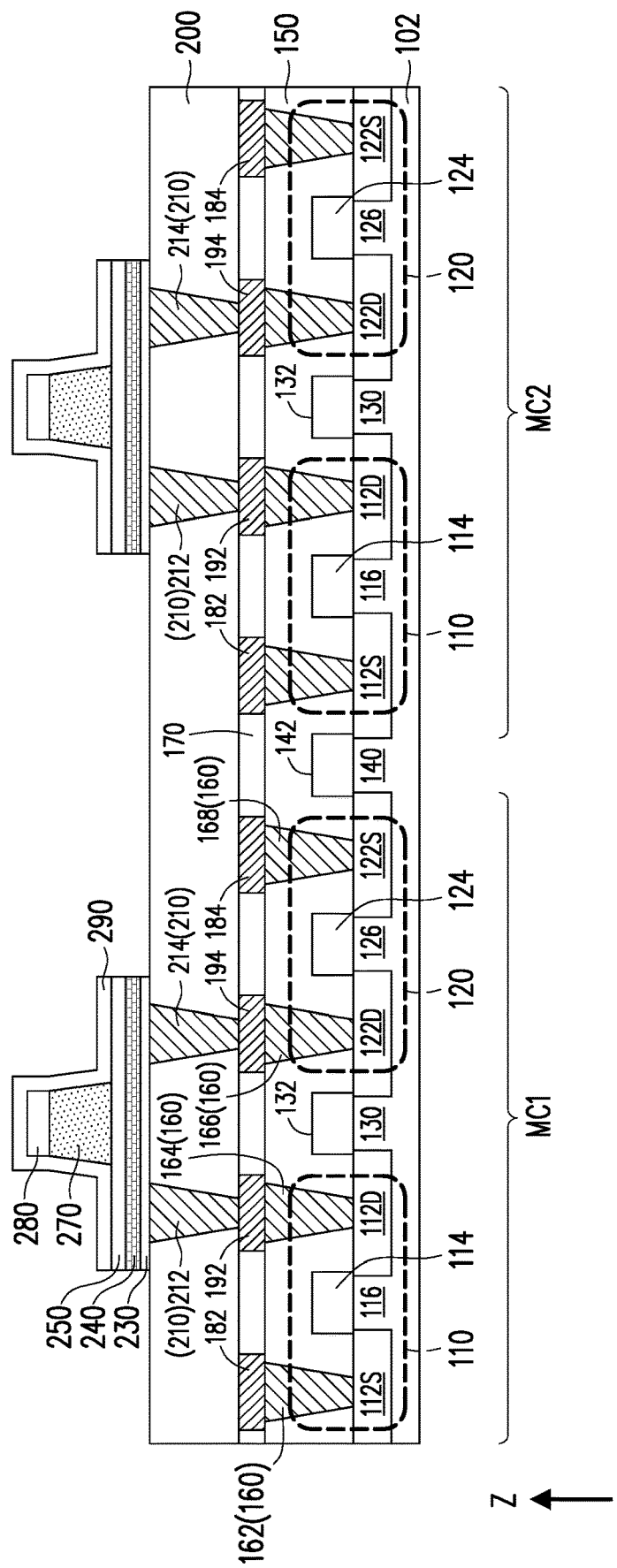

In FIG. 18, the protective layer 290 and the underlying layers of the spin Hall electrode 240 (as well as the separation layer 250 and the buffer layer 230, if included), are patterned for example via one or more etching steps, to define the spin Hall electrodes 240 of the individual memory cells MC1, MC2. The etching may be any acceptable etch process, such as wet or dry etching, a reactive ion etch (RIE), neutral beam etch (NBE), the like, or a combination thereof. The etching may be anisotropic.

Figure 19:
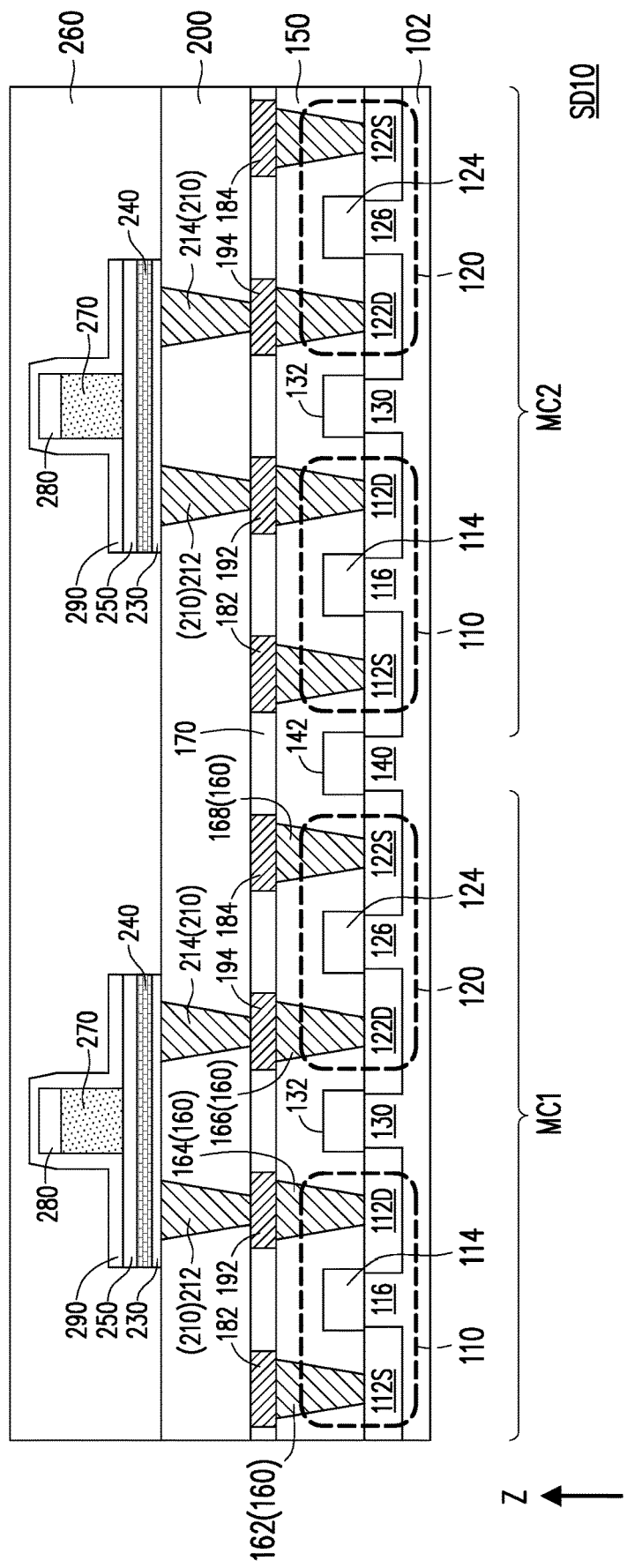

In FIG. 19, after patterning of the spin Hall electrodes 240, the ILD 260 is formed to encapsulate the spin Hall electrodes 240 and the MTJs 270. Material and processes to form the ILD 260 may be selected as previously described with reference to the ILD 150. In some embodiments, the ILD 260 is formed of sufficient thickness to completely cover the protective layer 290 even after planarization is performed. In some alternative embodiments, the ILD 260 may be planarized so as to expose the protective layer 290 on top of the hard mask 280, or even remove the portion of protective layer 290 extending on the hard mask 280, thus exposing the hard mask 280.

Figure 20:
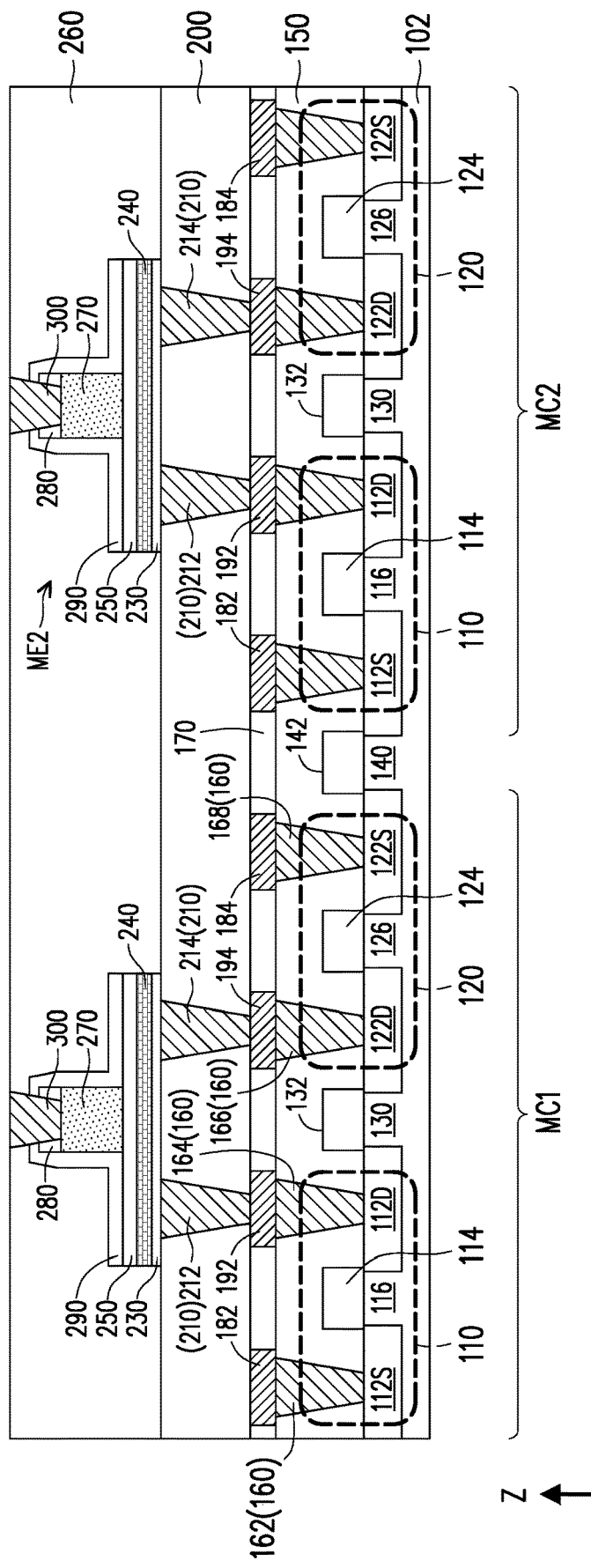

In FIG. 20, the conductive vias 300 are formed through the ILD 260 to contact the MTJs 270. Materials and processes to form the conductive vias 300 may be selected as previously described for the conductive vias 160. In some embodiments, the conductive vias 300 extend through the protective layer 290 and the hard mask 280 to contact the MTJs 270. In some embodiments, if the hard masks 280 are formed of conductive material and are used as top electrodes of the MTJs 270, the conductive vias 300 may land on the hard masks 280. The semiconductor device SD10 of FIG. 1 may be obtained from the structure of FIG. 20 by forming the ILD 310 and the conductive lines 320, for example following materials and processes previously discussed with reference to the ILD 170 and the conductive lines 182, 184. In some embodiments, additional process steps may be further included, for example to form additional interconnection tiers or to provide connective bumps to allow integration of the semiconductor device SD10 within larger devices.

In FIG. 21A is illustrated a cross-sectional view of a memory element ME22 of a semiconductor device SD22 according to some embodiments of the disclosure. The semiconductor device SD22 may have a similar structure as previously described for the semiconductor device SD10 of FIG. 1, and details not explicitly addressed in the following may be considered to be identical to what was previously described for the semiconductor device SD10. In some embodiments, the memory element ME22 also includes the spin Hall electrode 520 and the MTJ 270. The spin Hall electrode 520 is connected to the conductive vias 212, 214, with the buffer layer 230 optionally disposed between the spin Hall electrode 520 and the conductive vias 212, 214. The separation layer 250 may be disposed between the spin Hall electrode 520 and the MTJ 270. In some embodiments, the spin Hall electrode 520 includes three metal layers 521, 523, 525 alternately stacked with two spacer layers 522, 524. The metal layers 521, 523, 525 may have similar compositions as previously described for the metal layers 242, 246 of the memory element ME1 of FIG. 4, and the spacer layers 522, 524 may have similar compositions as previously described for the spacer layer 224 of FIG. 4. In some embodiments, the metal layers 521, 523, 525 include (or are formed of) mixture of $\alpha$-$\beta$-tungsten, and the spacer layers 522, 524 include (or are formed of) magnesium oxide. The spacer layers 522, 524 separate consecutive metal layers 521, 523, 525, similarly to what was previously described for the spacer layer 224 of FIG. 4.

In the semiconductor device SD22, the spacer layers 522, 524 have a single layer structure, as the spacer layer 224 of FIG. 4, however, the disclosure is not limited thereto. For example, in the memory elements ME24 of the semiconductor device SD24 illustrated in FIG. 21B, the spin Hall electrode 530 includes metal layers 531, 535, 539 separated by composite spacer layers 532, 536, each spacer layer 532, 536 having a similar structure as previously described for the spacer layer 344 of FIG. 5. For example, the spacer layer 532 may be disposed between the metal layers 531, 535 and may include the layer 533 formed on the metal layer 531 and the layer 534 formed on the layer 533, with the metal layer 535 being formed on the layer 534. The layer 533 may include a different material than the layer 534. The materials of the layers 533, 534 may be selected as previously described for the layers 345, 346 of FIG. 5. For example, the layer 534 may be an (amorphous) CoFeB layer, and the layer 533 may be a (hexagonal) magnesium layer. The spacer layer 536 may have the same structure of the spacer layer 532, with the layer 538 being an (amorphous) CoFeB layer, and the layer 537 being a (hexagonal) magnesium layer, for example. Naturally, the disclosure is not limited thereto, and other combinations of materials are possible and contemplated within the scope of the disclosure.

Figure 22A:
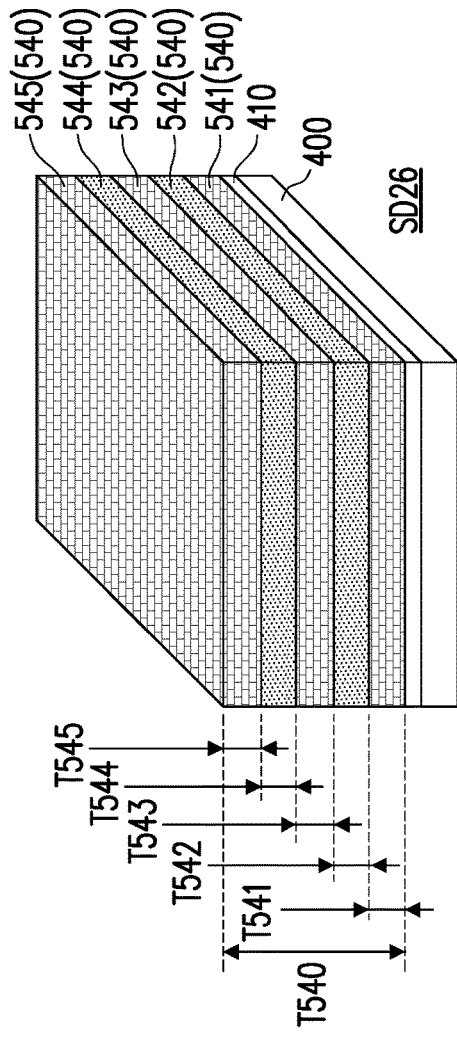
FIG. 22A and FIG. 22B are schematic perspective views of semiconductor devices according to some embodiments of the disclosure.

In order to characterize the spin Hall electrodes 520 of FIG. 21A and 530 of FIG. 21B, semiconductor devices SD26 as illustrated in FIG. 22A and semiconductor devices SD28 as illustrated in 22B were prepared. In the semiconductor devices SD26 and SD28, structures respectively corresponding to the spin Hall electrodes 520 and 530 were prepared over the substrate 400 on the oxide layer 410, following similar processes as previously described. Within an individual semiconductor device SD26 the metal layers 541, 543 and 545 were prepared as having same thicknesses T541, T543, T545 with respect to each other, and the spacer layers 542, 544 were prepared as having same thicknesses T542, T544 with respect to each other. The same applied for the metal layers 551, 555, 559 and spacer layers 552, 556 of the semiconductor devices SD28. Series of semiconductor devices SD26 and SD28 having different total thicknesses T541+T543+T545 and T551+T555+T559 of the metal layers 541, 543, 545, 551, 555, 559 were prepared. In the semiconductor devices SD26 of such series, the spacer layers 542, 544 were magnesium oxide layers with individual thicknesses T542, T544 of about 0.7 nm. In the semiconductor devices SD28 of such series, the spacer layers 552, 556 included $Co_{20}Fe_{60}B_{20}$ layers 554, 558 of individual thicknesses T554, T558 of about 0.8 nm, and magnesium layers 553, 557 of individual thicknesses T554, T558 of about 0.55 nm.

Figure 23A:
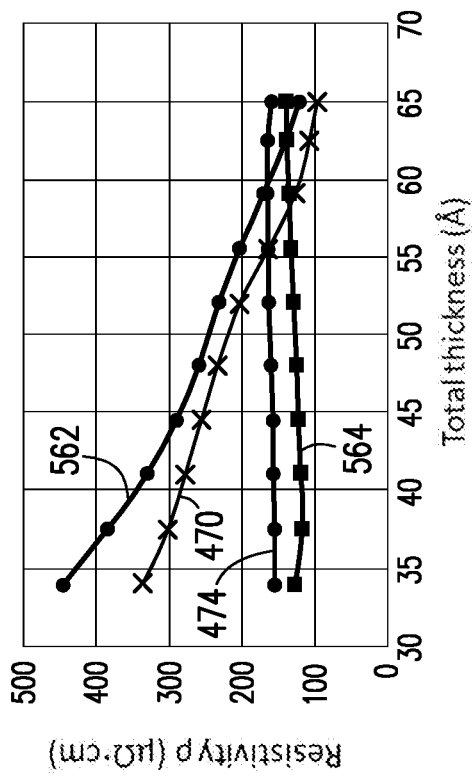
FIG. 23A to FIG. 24 are charts plotting characterization data of some semiconductor devices according to some embodiments of the disclosure.
Figure 23B:
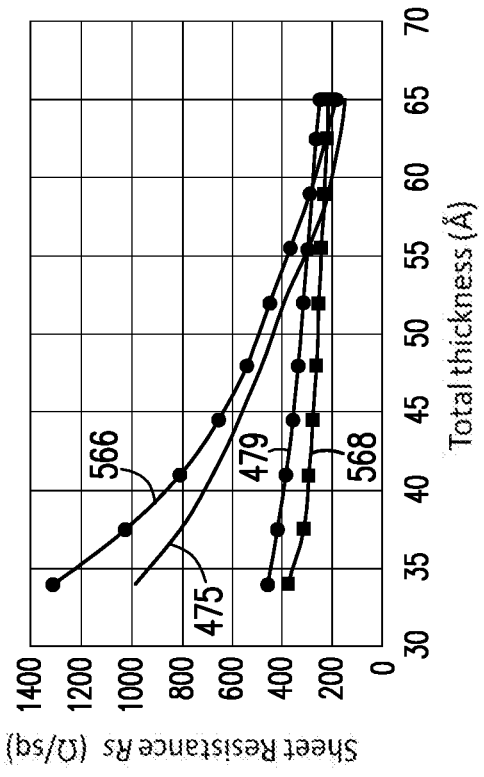

Semiconductor devices SD26, SD28 having corresponding total (metal) thicknesses T541+T543+T545 or T551+T555+T559 of about 34 Å, 37.5 Å, 41 Å, 44.5 Å, 48 Å, 52 Å, 55.5 Å, 59 Å, 62.5 Å, and 65 Å, were prepared and tested in the same manner as previously described for the semiconductor devices SD16, SD18, and SD20 of FIG. 7A to FIG. 7C. In the charts of FIG. 23A and FIG. 23B, the total thickness plotted on the abscissa axis refers to the combined thickness T541+T543+T545 or T551+T555+T559 of the mixture of $\alpha$-$\beta$-tungsten metal layers 541, 543, 545 or 551, 555, 559, thus excluding the thicknesses T542, T544, T552, T556 of the spacer layers 542, 544, 552, 556. In FIG. 23A and FIG. 23B, the data series 562 and 566 were obtained from the semiconductor devices SD26 and the data series 564 and 568 were obtained from the semiconductor devices SD28. For ease of comparison, in FIG. 23A and FIG. 23B are also plotted the data series 470 and 475 obtained from the semiconductor devices SD16, as well as the data series 474 and 479 obtained from the semiconductor devices SD18.

As illustrated by the data plotted in FIG. 23A and FIG. 23B, spin Hall electrodes including multiple simple spacer layers such as the spin Hall electrode 520 of FIG. 21A or 540 of FIG. 22A have higher resistivity $\rho$ and sheet resistance Rs than spin Hall electrodes including single simple spacer layers such as the spin Hall electrodes 240 of FIG. 4 or 420 of FIG. 7A. Without being bound to or limited by any theory, it is possible that the observed increase in resistivity $\rho$ and sheet resistance Rs may be originated by increased scattering at the interfaces between the magnesium oxide spacer layers (e.g., 542, 544) and the metal layers (e.g., 541, 543, 545). The enhanced stability of the metastable mixture of $\alpha$-$\beta$-tungsten is observed also for the semiconductor devices SD26.

Figure 22B:
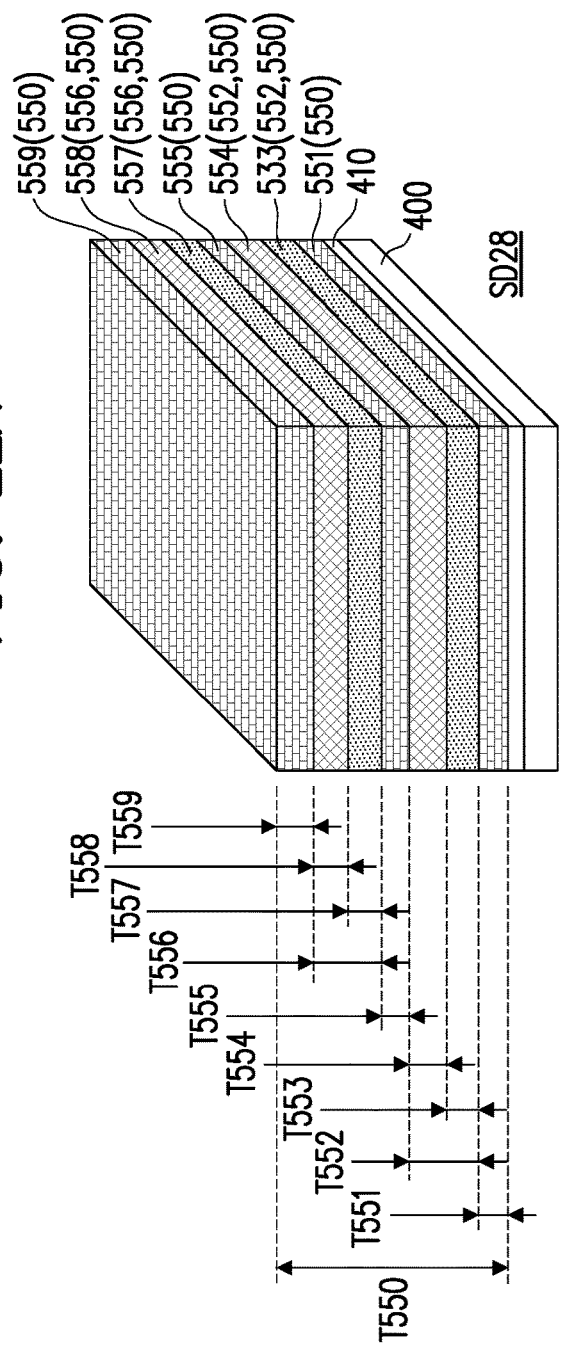
Figure 24:
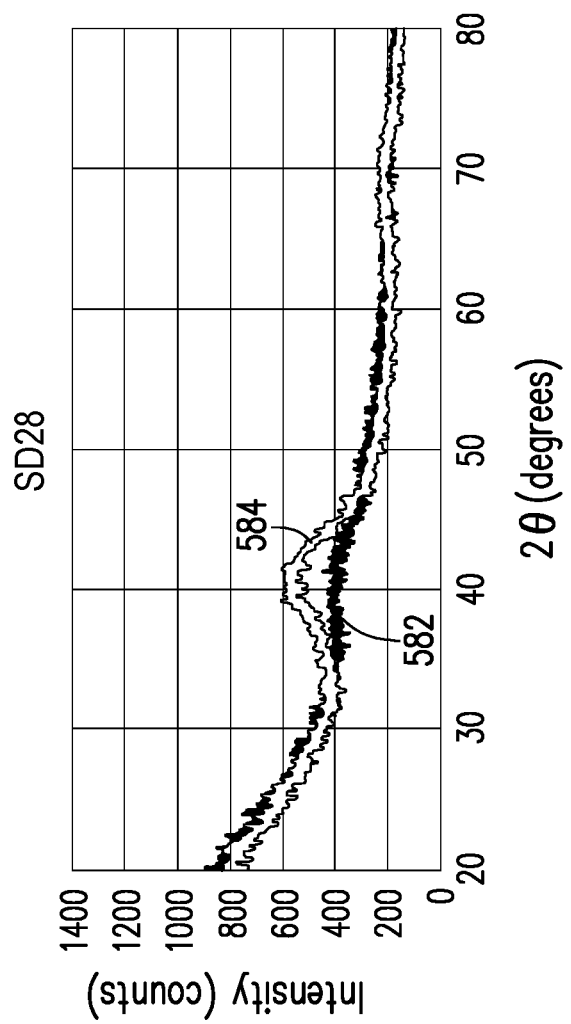

On the other hand, spin Hall electrodes including multiple composite spacers such as the spin Hall electrode 530 of FIG. 21B or 550 of FIG. 22B have lower resistance than spin Hall electrodes including single composite spacer layers such as the spin Hall electrodes 340 of FIG. 5 or 430 of FIG. 7B. Without being bound to or limited by any theory, it is possible that the observed decrease in resistance may be due to parallel resistance effect. Comparison of the data series 474 with 564 and 479 with 568 reveals that the stability of the mixture of $\alpha$-$\beta$-tungsten metal layers (e.g., 551, 555, 559) is comparable to the one observed for the spin Hall electrodes 340 or 430 including single composite spacer layers. That is, the transformation of mixture of $\alpha$-$\beta$-tungsten in $\alpha$-tungsten is severely inhibited if not completely halted. The comparable stability of the metastable mixture of $\alpha$-$\beta$-tungsten layers is further confirmed by analysis of the X-ray diffraction pattern for the semiconductor devices SD28, as plotted in FIG. 24. Comparison of the diffraction patterns measured for semiconductor devices SD28 having a total thickness T551+T555+T559 of the metal layers 551, 555, 559 of about 38 Å (line 582) and 63 Å (line 584), reveals little changes if any, without significant increase of the peaks originating from $\alpha$-tungsten.

Figure 25:
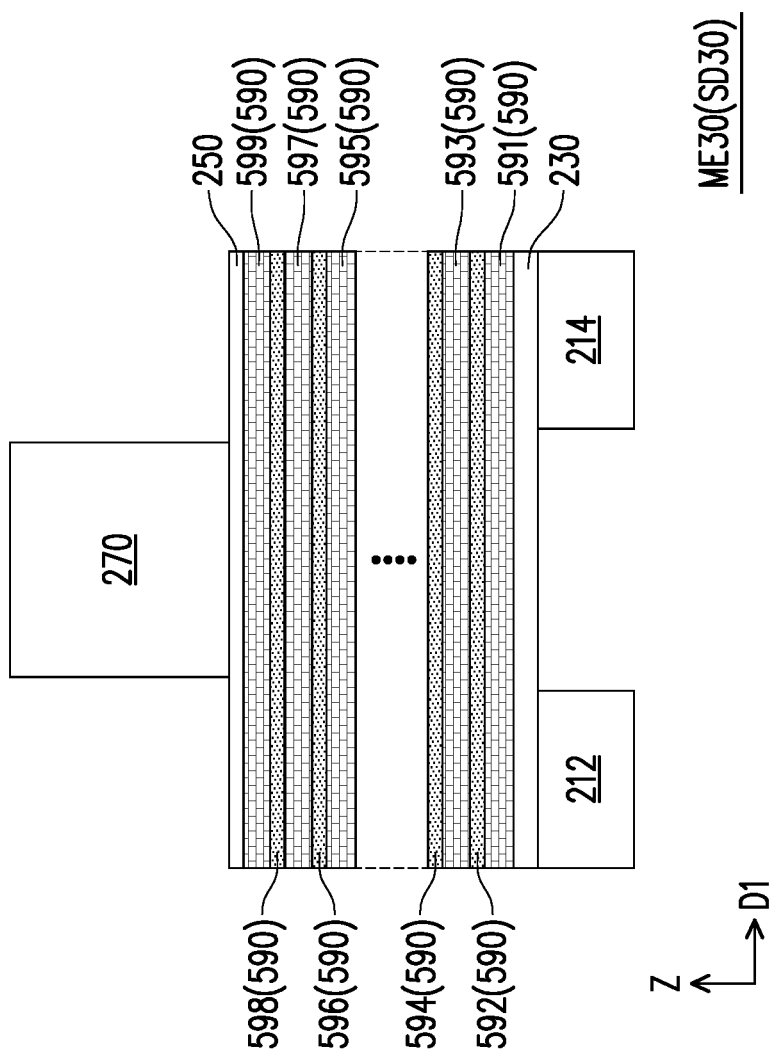
FIG. 25 and FIG. 26 are schematic cross-sectional views memory cells of semiconductor devices according to some embodiments of the disclosure.

In FIG. 25 is illustrated a cross-sectional view of a memory element ME30 of a semiconductor device SD30 according to some embodiments of the disclosure. The semiconductor device SD30 may have a similar structure as previously described for the semiconductor device SD10 of FIG. 1, and details not explicitly addressed in the following may be considered to be identical to what was previously described for the semiconductor device SD10. In some embodiments, the memory element ME30 also includes the spin Hall electrode 590 and the MTJ 270. The spin Hall electrode 590 is connected to the conductive vias 212, 214, with the buffer layer 230 optionally disposed between the spin Hall electrode 520 and the conductive vias 212, 214. The separation layer 250 may be disposed between the spin Hall electrode 520 and the MTJ 270. In some embodiments, the spin Hall electrode 520 includes multiple metal layers 591, 593, 595, 597, 599 alternately stacked with spacer layers 592, 594, 596, 598. In FIG. 25, only some metal layers 591, 593, 595, 597, 599 and spacer layers 592, 594, 596, 598 may be illustrated, with additional layers schematically represented by dots. The disclosure does not limit the number of metal layers 591, 593, 595, 597, 599 or spacer layers 592, 594, 596, 598, and the number of metal layers 591, 593, 595, 597, 595 and spacer layers 592, 594, 596, 598 may be determined based on application requirements. The metal layers 591, 593, 595 597, 599 may have similar compositions as previously described for the metal layers 242, 246 of the memory element ME1 of FIG. 4, and the spacer layers 592, 594, 596, 598 may have similar compositions as previously described for the spacer layer 224 of FIG. 4. In some embodiments, the metal layers 591, 593, 595 597, 599 include (or are formed of) mixture of α-β-tungsten, and the spacer layers 592, 594, 596, 598 include (or are formed of) magnesium oxide. For example, each metal layer 591, 593, 595 597, 599 may be a mixture of α-β-tungsten layer having a thickness in a range from about 1 nm to 3 nm, such as 2.5 nm, and each spacer layer 592, 594, 596, 598 may be a magnesium oxide layer having a thickness in a range from about 0.21 nm to about 0.84 nm, corresponding to about 1 to 4 monolayers of magnesium oxide. Such a spin Hall electrode 590 has a thermal stability up to 400° C. and a spin Hall angle α of about 0.45. The spacer layers 592, 594, 596, 598 separate consecutive metal layers 591, 593, 595 597, 599, similarly to what was previously described for the spacer layer 224 of FIG. 4.

Figure 26:
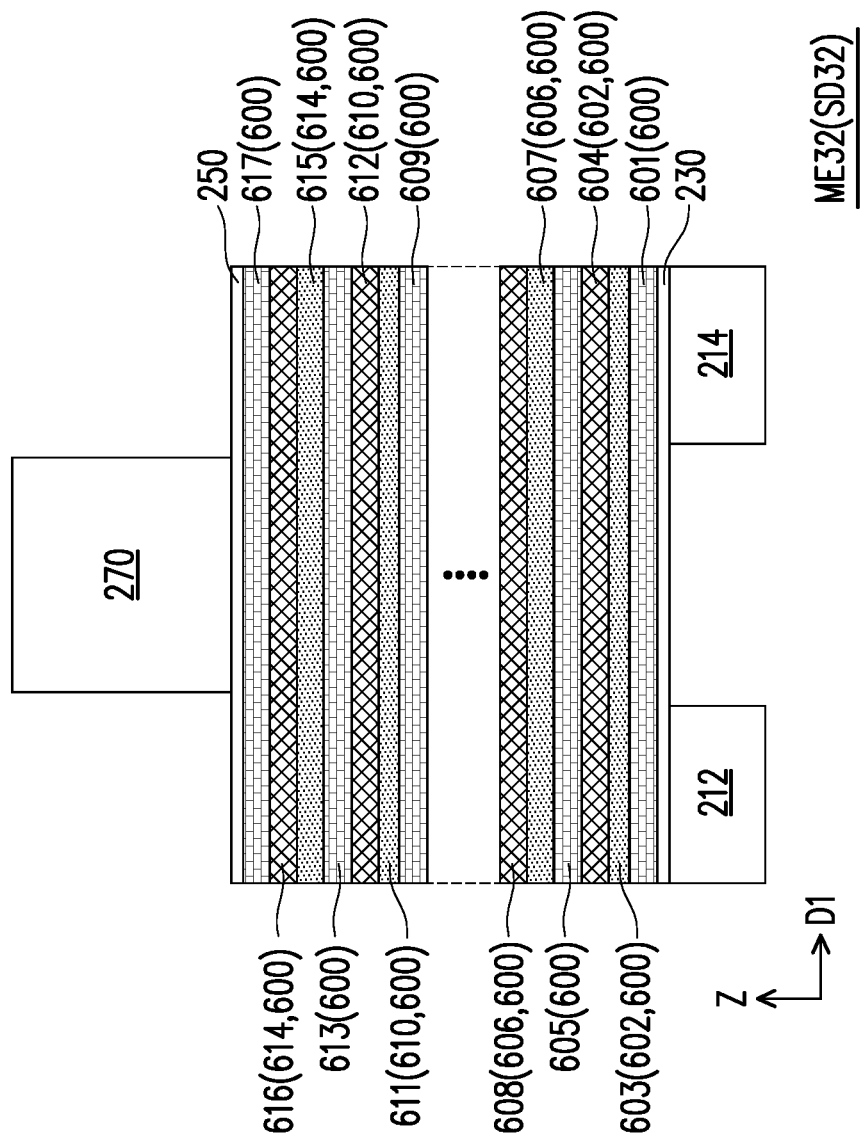

In the semiconductor device SD30, the spacer layers 592, 594, 596, 598 have a simple single layer structure, as the spacer layer 224 of FIG. 4, however, the disclosure is not limited thereto. For example, in the memory elements ME32 of the semiconductor device SD32 illustrated in FIG. 26, the spin Hall electrode 600 includes metal layers 601, 605, 609, 613, 617 separated by composite spacer layers 602, 606, 610, 614 each spacer layer 602, 606, 610, 614 having a similar structure as previously described for the spacer layer 344 of FIG. 5. For example, the spacer layer 602 may be disposed between the metal layers 601 and 605 and may include the layer 603 formed on the metal layer 601 and the layer 604 formed on the layer 603, with the metal layer 605 being formed on the layer 604. The layer 603 may include a different material from the layer 604. The materials of the layers 603, 604 may be selected as previously described for the layers 46 of FIG. 5. For example, the layer 604 may be an (amorphous) CoFeB layer, and the layer 603 may be a (hexagonal) magnesium layer. The other spacer layers 606, 610, 614 may have the same structure of the spacer layer 602, with the layers 608, 612, 616 being (amorphous) CoFeB layers, and the layers 607, 611, 615 being (hexagonal) magnesium layers, for example. For example, each metal layer 601, 605, 609, 613, 617 may be a mixture of α-β-tungsten layer having a thickness in a range from about 1 nm to 4 nm, such as 3.3 nm; each layer 604, 608, 612, 616 may be a CoFeB layer having a thickness in a range from about 0.14 nm to about 0.86 nm, corresponding to about 1 to 6 monolayers of CoFeB, such as about 0.8 nm; and each layer 603, 607, 611, 615 may be a magnesium layer having a thickness in a range from about 0.07 nm to about 1.04 nm, corresponding to about 1 to 4 monolayers of magnesium. Such a spin Hall electrode 600 has a thermal stability up to 400° C. and a spin Hall angle α of about 0.39. Naturally, the disclosure is not limited thereto, and other combinations of materials are possible and contemplated within the scope of the disclosure.

Figure 27:
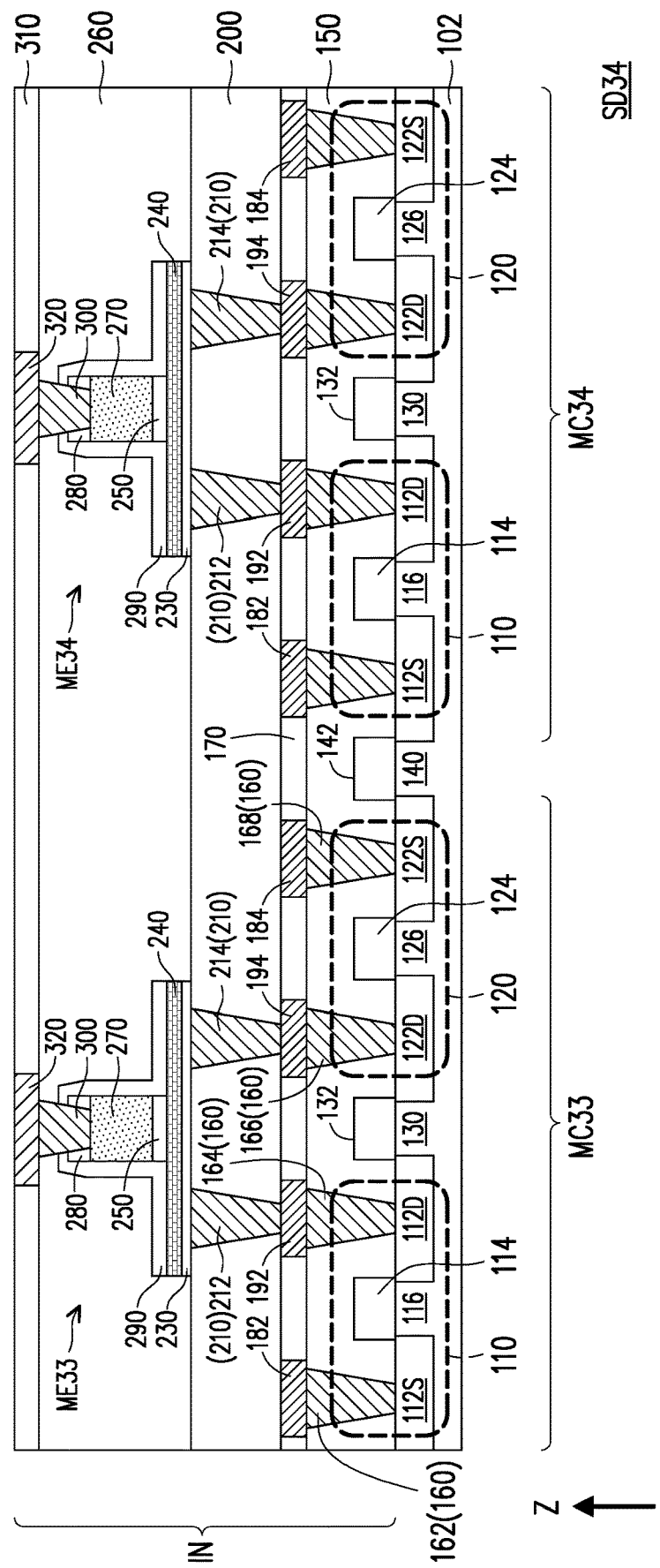
FIG. 27 to FIG. 29 are schematic views of semiconductor devices according to some embodiments of the disclosure.

In FIG. 27 is illustrated a schematic view of a semiconductor device SD34 according to some embodiments of the disclosure. The semiconductor device SD34 may have a similar structure as previously described for the semiconductor device SD10 of FIG. 1, and details not explicitly addressed in the following may be considered to be identical to what was previously described for the semiconductor device SD10. The semiconductor device SD34 includes memory cells MC33, MC34 having a similar structure to the memory cells MC1, MC2 of FIG. 1. A difference between the memory elements ME33, ME34 of the semiconductor device SD34 and the memory elements ME1, ME2 of the semiconductor device SD1 lies in the relative extension of the separation layer 250 with respect to the underlying spin Hall electrode 240. For example, in the process illustrated in FIG. 15 to FIG. 17, the separation layers 250 are patterned together with the layers of the spin Hall electrodes 240, so that the separation layers 250 laterally protrude with respect to the overlying MTJs 270 and have substantially a same footprint as the underlying spin Hall electrodes 240. In the semiconductor device SD34, however, the separation layers 250 are patterned together with the overlying MTJs 270, so that the spin Hall electrodes 240 laterally protrude with respect to the overlying separation layers 250. Consequently, the protective layers 290 are in contact with the portions of the spin Hall electrodes 240 left exposed by the separation layers 250. In some embodiments, the 3-D atomic structure of the protective layers 290 differs from the 3-D atomic structure of the topmost metal layer of the spin Hall electrode 240. Naturally, while the spin Hall electrodes 240 are included in the semiconductor device SD34, the disclosure is not limited thereto. In some alternative embodiments, any other spin Hall electrode discussed above such as—but not limited to—the spin Hall electrode 340 of FIG. 5, 520 of FIG. 21A, or 530 of FIG. 21B may be included in place of the spin Hall electrode 240. Alternatively stated, patterning of the separation layer 250 as done in the semiconductor device SD34 may be applied to any other memory element of the disclosure.

Figure 28:
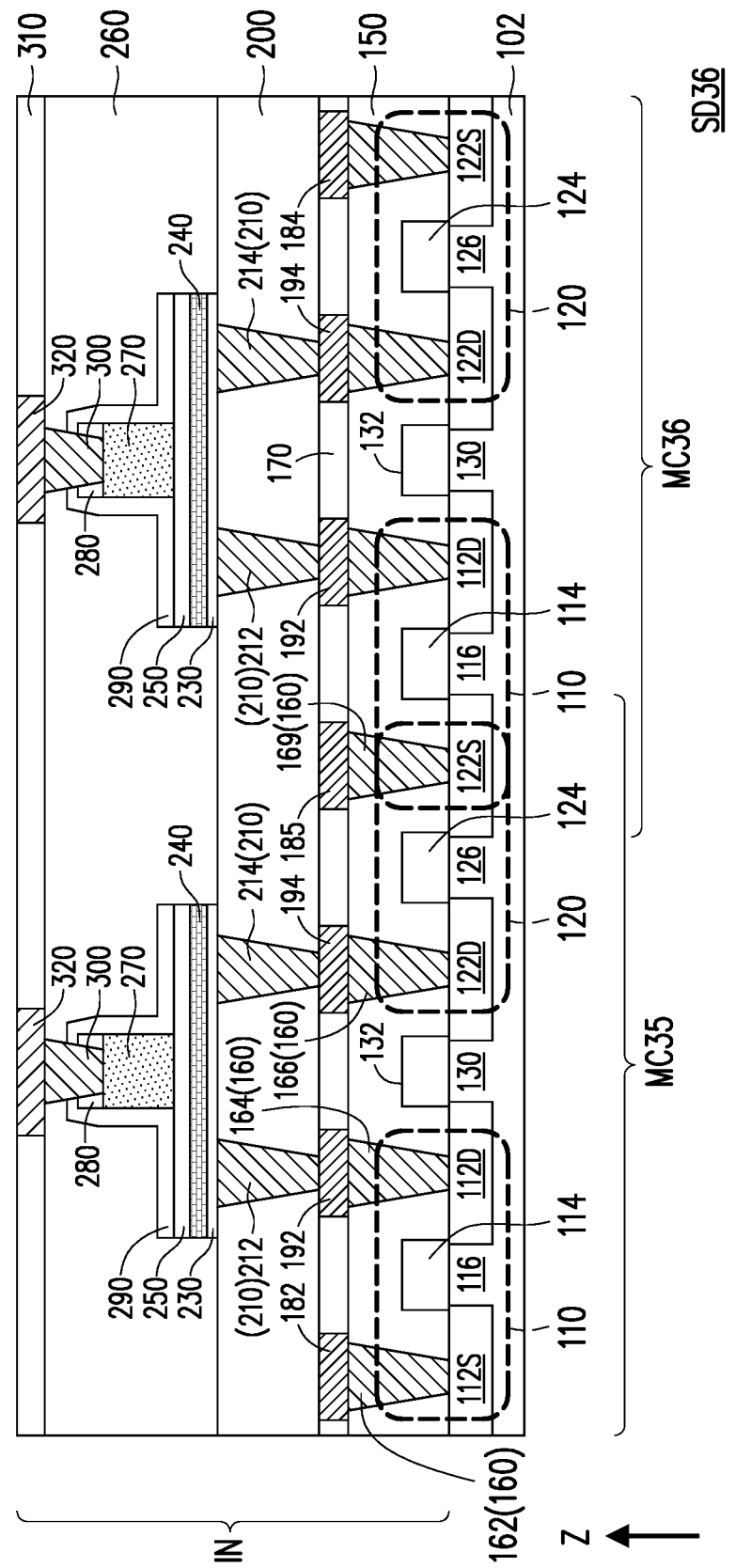

In FIG. 28 is illustrated a schematic view of a semiconductor device SD36 according to some embodiments of the disclosure. The semiconductor device SD36 may have a similar structure as previously described for the semiconductor device SD10 of FIG. 1, and details not explicitly addressed in the following may be considered to be identical to what was previously described for the semiconductor device SD10. The semiconductor device SD36 includes memory cells MC35, MC36 having a similar structure to the memory cells MC1, MC2 of FIG. 1. A difference between the memory cells MC35, MC36 of the semiconductor device SD36 and the memory cells MC1, MC2 of the semiconductor device SD1 lies in that the transistor 120 of the memory cell MC35 shares the source region 122S with the transistor 110 of the adjacent memory cell MC36. That is, a common conductive line 185 may be connected to the source region 122S by a common conductive via 169. Because each memory cells MC35, MC36 is controlled by a pair of driving transistors 110, 120, even if one of the conductive lines 185 acting as source line is shared between the two memory cells MC36, MC36, the memory cells MC35, MC36 may still be selectively addressed with respect to each other in view of the non-shared conductive lines 182 and 184. In some embodiments, by having adjacent memory cells MC35, MC36 sharing one conductive line 185, the device density of the semiconductor device SD36 may be increased. Naturally, while the spin Hall electrodes 240 are included in the semiconductor device SD36, the disclosure is not limited thereto. In some alternative embodiments, and any other spin Hall electrode disclosed above such as—but not limited to—the spin Hall electrode 340 of FIG. 5, 520 of FIG. 21A, or 530 of FIG. 21B may be included in place of the spin Hall electrode 240.

Figure 29:
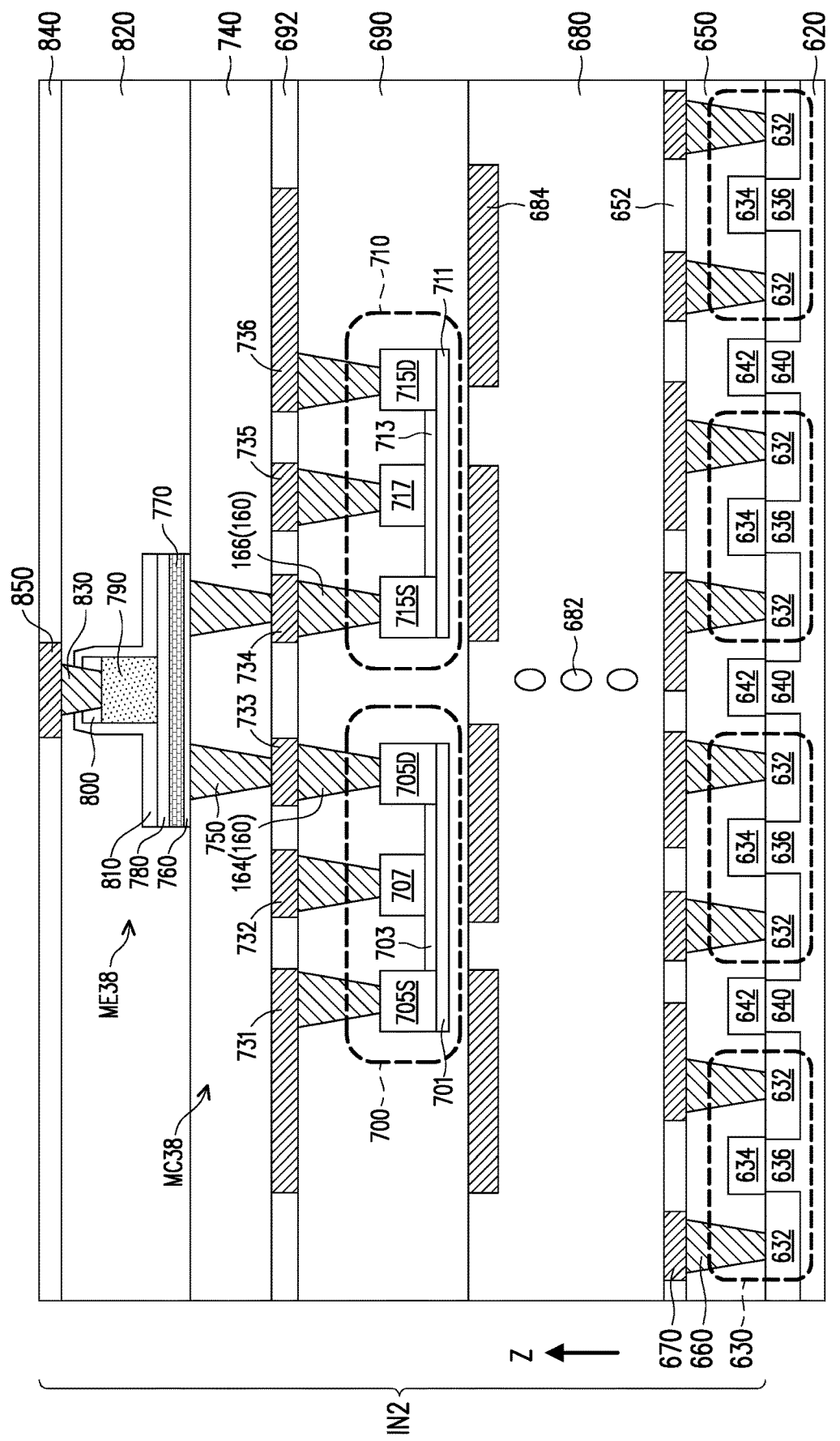

In FIG. 29 is illustrated a schematic view of a semiconductor device SD38 according to some embodiments of the disclosure. The semiconductor device SD36 may have a similar structure as previously described for the semiconductor device SD10, and details not explicitly addressed in the following may be considered to be identical to what was previously described for the semiconductor device SD10. The semiconductor device SD38 also includes a semiconductor substrate 620 having active and passive devices formed thereon, such as the transistors 630. The transistors 630 may have similar structure as the transistors 110, 120, including a source and drain regions 632, gate structures 634 disposed on channel regions 636 between the source and drain regions 632. The transistors 630 may have any transistor geometry, such as, but not limited to, planar transistor, FinFET, gate-all-around, etc. Dummy channels 640 and dummy gate structures 642 may be formed between adjacent transistors 630 for increased process uniformity. One or more ILDs 650, 652 may be formed on the semiconductor substrate 620, having conductive vias 660 and conductive lines 670 extending therethrough to contact the active and passive devices formed on the semiconductor substrate 620. Additional interconnection tiers may be formed on the lowest ILDs 650, 652, each additional tier including its own interlayer dielectric 680 and conductive traces 682 (schematically represented by dots in FIG. 29) and 684.

In some embodiments, transistors 700, 710 are embedded within an upper ILD 690, within the interconnection structure IN2 of the semiconductor device SD38. The transistors 700, 710 may be back-end-of-line (BEOL) transistors, each comprising a corresponding semiconductor channel layer 701 or 711, a high-k dielectric layer 703 or 713, source and drain contacts 705S, 705D or 715S, 715D, and a gate contact 707 or 717. Portions of the interlayer dielectric 690 may separate the transistors 700, 710 from each other and from the underlying conductive lines 684. While the transistors 700, 710 have been illustrated with a certain geometry in FIG. 29, the disclosure is not limited thereto, and any transistor architecture may be adopted for the transistors 700, 710 according to application requirements.

In some embodiments, the transistors 700, 710 are used as driving transistors of the memory cells MC38 of the semiconductor device SD38. That is, in the semiconductor device SD38, the transistors 630 formed on the semiconductor substrate 620 may be used to perform other logic functions, while the BEOL transistors 700, 710 are integrated in the memory cells MC38. The source and drain contacts 705S, 705D, 715S, 715D and the gate contacts 707, 717 of the driving transistors 700, 710 are contacted by dedicated contact vias 720 so as to be connected to corresponding conductive lines 731, 732, 735, 736 or conductive patterns 733, 734. For example, the conductive lines 731, 736 may be used as source lines for the memory cells MC38 and the conductive lines 732, 735 may be used to apply a potential to the gate contacts 707, 717, which may be used as word lines for the memory cells MC38. The conductive patterns 733, 734 bridge the conductive vias 720 landing on the drain contacts 705D, 715D to the conductive vias 750 extending which extend through the ILD 740 to connect the transistors 700, 710 to the memory elements ME38 of the memory cells MC38. The memory elements ME38 may have the structure of any other memory element of the disclosure. For example, the memory elements ME38 include the spin Hall electrode 770 and an MTJ 790, where the spin Hall electrode 770 may have the structure of any spin Hall electrode disclosed above such as—but not limited to—the spin Hall electrode 240 of FIG. 4, 340 of FIG. 5, 520 of FIG. 21A, or 530 of FIG. 21B. The buffer layer 760 and the spacer layer 780 may be optionally included, and the spacer layer 780 may be coextensive with the spin Hall electrode 770 or with the MTJ 790. The memory elements ME38 may further include hard masks 800 and protective layer 810, configured according to any one of the embodiments disclosed above, possibly embedded within the ILD 820. Conductive vias 830 connect the MTJs 790 to conductive lines 850 embedded in the ILD 840, where the conductive lines 850 are used as bit lines of the memory cells MC38. While in FIG. 29 the driving transistors 700, 710 are disposed between the spin Hall electrodes 770 and the semiconductor substrate 620, the disclosure is not limited thereto. In some alternative embodiments, the MTJs 270 may be interposed between the spin Hall electrodes 770 and the semiconductor substrate 620, and the spin Hall electrodes 770 may be disposed between the driving transistors 700, 710 and the semiconductor substrate 620.

Although the embodiments of the spin Hall electrodes (e.g., 240, 340, 360, 420, 440, 460, 520, 530, 540, 550, 590, 600, and 770) described above were generally described and illustrated with metal layer being formed first before a spacer layer, the formation of the above-listed spin Hall electrodes can have a spacer layer formed before any metal layer. For example, in FIG. 4, the spacer layer 244 can be followed by the metal layer 242 being formed on the spacer layer 244. In this example, another spacer layer may be formed on the metal layer 242 and optionally followed by another metal layer 246 as determined for the spin Hall electrode design.

In some embodiments, the stack of layers in the spin Hall electrodes may be repeated up to ten times. For example, in the spin Hall electrode 240 of FIG. 4, the stack of layers 242/244/246 may be repeated up to ten times.

An embodiment includes a semiconductor device. The semiconductor device includes a pair of transistors on a semiconductor substrate, an interconnect structure over the pair of transistors, the interconnect structure including metal lines and vias over and connected to the pair of transistors, a composite spin hall electrode over the metal lines and vias, the composite spin hall electrode being electrically connected to the pair of transistors by the metal lines and vias, the composite spin hall electrode including a first metal layer and a first spacer layer, the first metal layer including a first heavy metal in a mixture of an α-β state, and the first spacer layer including a first material different from the first metal layer. The device also includes a magnetic tunnel junction over the composite spin hall electrode.

Embodiments may include one or more of the following features. The semiconductor device where the first metal is mixture of α-β-tungsten. The first spacer layer includes a metal oxide. The metal oxide is magnesium oxide with a face centered cubic crystal structure. The first spacer layer is over the first metal layer. The semiconductor device further including a second metal layer over the first spacer layer, the second metal layer including a first heavy metal in a mixture of an α-β state. The first metal layer is over the first spacer layer. The semiconductor device further including a second spacer layer over the first metal layer, the second spacer layer including the first material different from the first metal layer. The first spacer layer is made of an insulating material. The first spacer layer is made of a crystalline metal and an amorphous ferromagnetic material.

An embodiment includes a memory device. The memory device includes a first memory cell over a substrate, the first memory cell including a first transistor and a second transistor on the substrate, first conductive lines and vias over and electrically coupled to the first and second transistors, a composite spin hall electrode over and electrically coupled to the first conductive lines and vias, the composite spin hall electrode including a first tungsten-based layer and a second tungsten-based layer separated by a first spacer, the first tungsten-based layer including a first mixture of α-β-tungsten, the second tungsten-based layer including a second mixture of α-β-tungsten, a magnetic tunnel junction over the second tungsten-based layer, and second conductive lines and vias over and electrically coupled to the magnetic tunnel junction.

Embodiments may include one or more of the following features. The memory device where the first spacer is configured to interrupt the transformation of tungsten from β phase to α phase in the first tungsten-based layer and a second tungsten-based layer. The composite spin hall electrode further includes a third tungsten-based layer over the second tungsten-based layer and separated from the second tungsten-based layer by a second spacer, the third tungsten-based layer including a third mixture of α-β-tungsten. The second spacer includes a plurality of layers, at least one of the plurality of layers being a crystalline material and at least one of the plurality of layers being an amorphous material, where the crystalline material includes magnesium, and where the amorphous material includes cobalt. The memory device further including a buffer layer between the first conductive lines and vias and the composite spin hall electrode.

An embodiment includes a method. The method includes forming transistors on a substrate, forming a composite spin hall electrode over and electrically coupled to the transistors, and forming a magnetic tunnel junction over the composite spin hall electrode. The method also includes where forming the composite spin hall electrode includes depositing a first layer of a first material, the first material being a hall metal in a metastable state and capable of transforming to a stable state, depositing a second layer of a second material on the first layer of the first material, the second layer having a different composition than the first material, depositing a third layer of the first material in the metastable state on the second layer of the second material. The method also includes annealing the first layer, the second layer, and the third layer, and, after annealing, the first material in the first layer and in the third layer including the first material in a mixture of the metastable state and the stable state.

Embodiments may include one or more of the following features. The method where forming the composite spin hall electrode further includes depositing a fourth layer of a third material on the second layer before depositing the third layer, where the third material has a different composition than the second material. At least one selected from the third material and the second material remains amorphous after the annealing. The first layer and the third layer include a mixture of α-β-tungsten.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a pair of transistors on a semiconductor substrate;
    an interconnect structure over the pair of transistors, the interconnect structure comprising:
        metal lines and vias over and connected to the pair of transistors;
        a composite spin Hall electrode over the metal lines and vias, the composite spin Hall electrode being electrically connected to the pair of transistors by the metal lines and vias, the composite spin Hall electrode comprising:
            a first metal layer comprising a first heavy metal that includes a mixture of an α-β state;
            a first spacer layer comprising a first material different from the first metal layer; and
            a second metal layer over the first spacer layer, the second metal layer comprising the first heavy metal, wherein the first spacer layer is disposed between and in physical contact with the first metal layer and the second metal layer, and wherein the first spacer layer comprises an oxide; and
        a magnetic tunnel junction over the composite spin Hall electrode.

2. The semiconductor device of claim 1, wherein the first heavy metal is mixture of α-β-tungsten.

3. The semiconductor device of claim 1, wherein the first spacer layer comprises a metal oxide.

4. The semiconductor device of claim 3, wherein the metal oxide is magnesium oxide with a face centered cubic crystal structure.

5. The semiconductor device of claim 1, wherein the first spacer layer is over the first metal layer.

6. The semiconductor device of claim 5,
    wherein the second metal layer comprises the first heavy metal in a mixture of an α-β state.

7. The semiconductor device of claim 1, wherein the first metal layer comprises an alloy.

8. The semiconductor device of claim 7, further comprising:
    a second spacer layer over the first metal layer, the second spacer layer comprising the first material different from the first metal layer.

9. The semiconductor device of claim 1, wherein the first spacer layer is made of an insulating material.

10. The semiconductor device of claim 1, wherein the first spacer layer is made of an amorphous material.

11. A memory device, comprising:
    a first memory cell over a substrate, the first memory cell comprising:
        a first transistor and a second transistor on the substrate;
        first conductive lines and vias over and electrically coupled to the first and second transistors;

a composite spin Hall electrode over and electrically coupled to the first conductive lines and vias, the composite spin Hall electrode comprising a first tungsten-based layer and a second tungsten-based layer separated by a first spacer, the first tungsten-based layer comprising a first mixture of α-β-tungsten, the second tungsten-based layer comprising a second mixture of α-β-tungsten;

a magnetic tunnel junction over the second tungsten-based layer; and second conductive lines and vias over and electrically coupled to the magnetic tunnel junction.

12. The memory device of claim 11, wherein the first spacer is configured to interrupt the transformation of tungsten from β phase to α phase in the first tungsten-based layer and a second tungsten-based layer.

13. The memory device of claim 11, wherein the composite spin Hall electrode further comprises a third tungsten-based layer over the second tungsten-based layer and separated from the second tungsten-based layer by a second spacer, the third tungsten-based layer comprising a third mixture of α-β-tungsten.

14. The memory device of claim 13, wherein the second spacer comprises a plurality of layers, at least one of the plurality of layers being a crystalline material and at least one of the plurality of layers being an amorphous material, wherein the crystalline material comprises magnesium, and wherein the amorphous material comprises cobalt.

15. The memory device of claim 11, further comprising:
a buffer layer between the first conductive lines and vias and the composite spin Hall electrode.

16. A method, comprising:
forming transistors on a substrate;
forming a composite spin Hall electrode over and electrically coupled to the transistors, and
forming a magnetic tunnel junction over the composite spin Hall electrode, wherein forming the composite spin Hall electrode comprises:
depositing a first layer of a first material, the first material being a Hall metal in a metastable state and capable of transforming to a stable state;
depositing a second layer of a second material on the first layer of the first material, the second layer having a different composition than the first material;
depositing a third layer of the first material in the metastable state on the second layer of the second material; and
annealing the first layer, the second layer, and the third layer, and, after annealing, the first material in the first layer and the third layer includes a mixture of the metastable state and the stable state.

17. The method of claim 16, wherein forming the composite spin Hall electrode further comprises:
depositing a fourth layer of a third material on the second layer before depositing the third layer, wherein the third material has a different composition than the second material.

18. The method of claim 17, wherein at least one selected from the third material and the second material remains amorphous after the annealing.

19. The method of claim 16, wherein the first layer and the third layer comprise a mixture of α-β-tungsten.

20. The method of claim 16, wherein forming the composite spin Hall electrode further comprises:
depositing a fourth layer of the first material in the metastable state on the second layer of the second material, and
depositing a fifth layer of the second material on the fourth layer of the first material before depositing the first layer, wherein the third layer of the first material is deposited on the fifth layer.

* * * * *